US008339230B2

(12) United States Patent
Hijioka et al.

(10) Patent No.: US 8,339,230 B2
(45) Date of Patent: Dec. 25, 2012

(54) INDUCTOR ELEMENT, INDUCTOR ELEMENT MANUFACTURING METHOD, AND SEMICONDUCTOR DEVICE WITH INDUCTOR ELEMENT MOUNTED THEREON

(75) Inventors: Kenichiro Hijioka, Tokyo (JP); Akira Tanabe, Tokyo (JP); Yoshihiro Hayashi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 285 days.

(21) Appl. No.: 12/375,944

(22) PCT Filed: Aug. 1, 2007

(86) PCT No.: PCT/JP2007/065102
§ 371 (c)(1),
(2), (4) Date: Feb. 2, 2009

(87) PCT Pub. No.: WO2008/016089
PCT Pub. Date: Feb. 7, 2008

(65) Prior Publication Data
US 2009/0315662 A1 Dec. 24, 2009

(30) Foreign Application Priority Data
Aug. 1, 2006 (JP) .................... 2006-209915

(51) Int. Cl.
*H01F 5/00* (2006.01)
*H01F 27/28* (2006.01)
*H01F 7/06* (2006.01)

(52) U.S. Cl. .................. 336/200; 336/232; 29/602.1

(58) Field of Classification Search .................. 336/200, 336/232; 29/602.1
See application file for complete search history.

(56) References Cited

U.S. PATENT DOCUMENTS

| 5,414,402 | A | * | 5/1995 | Mandai et al. | 336/200 |
|---|---|---|---|---|---|
| 5,610,433 | A | * | 3/1997 | Merrill et al. | 257/531 |
| 6,498,555 | B1 | * | 12/2002 | Sakata | 336/200 |
| 6,559,751 | B2 | * | 5/2003 | Liu et al. | 336/223 |
| 7,064,645 | B2 | * | 6/2006 | Kobayashi et al. | 336/200 |
| 7,078,998 | B2 | * | 7/2006 | Zhang et al. | 336/200 |

(Continued)

FOREIGN PATENT DOCUMENTS

JP 55096605 A 7/1980

(Continued)

OTHER PUBLICATIONS

International Search Report for PCT/JP2007/065102 mailed Nov. 6, 2007.

*Primary Examiner* — Mohamad Musleh
*Assistant Examiner* — Tsz Chan
(74) *Attorney, Agent, or Firm* — Sughrue Mion, PLLC

(57) ABSTRACT

An inductor element is formed in a multiple layer lead structure including a lead, an insulative layer that insulates leads above and below, and a via provided in the insulative layer and connecting leads above and below wherein lead layers are multiply laminated layers, characterized in that: at least a portion of at least a pair of vertically adjacent leads are coiled leads; the coiled leads are connected in series, wherein current directions of vertically adjacent coiled leads are the same by a via provided on an end portion thereof, and form a serial inductance; and an inter-lead capacitance of the vertically adjacent coiled leads is larger than an inter-lead capacitance between other coiled leads formed in the same lead layer.

27 Claims, 25 Drawing Sheets

U.S. PATENT DOCUMENTS

| | | |
|---|---|---|
| 7,262,481 B1 * | 8/2007 | Marques .................. 257/531 |
| 2003/0231093 A1 * | 12/2003 | Hsu et al. .................. 336/200 |
| 2004/0012474 A1 * | 1/2004 | Hwu et al. .................. 336/200 |
| 2004/0108933 A1 * | 6/2004 | Chen et al. .................. 336/200 |
| 2004/0140877 A1 * | 7/2004 | Nakao et al. .................. 336/200 |
| 2005/0104705 A1 * | 5/2005 | Mukherjee et al. .................. 336/200 |
| 2005/0116802 A1 * | 6/2005 | Gomez et al. .................. 336/200 |
| 2006/0125589 A1 * | 6/2006 | Tamata et al. .................. 336/200 |

FOREIGN PATENT DOCUMENTS

| | | |
|---|---|---|
| JP | UM60136156 A | 9/1985 |
| JP | 61265857 A | 11/1986 |
| JP | UM62157106 A | 10/1987 |
| JP | 03089548 A | 4/1991 |
| JP | UM05062010 A | 8/1993 |
| JP | 05275247 A * | 10/1993 |
| JP | 06061058 A | 3/1994 |
| JP | 06061071 A * | 3/1994 |
| JP | 08330137 A | 12/1996 |
| JP | 11054944 A | 2/1999 |
| JP | 2976926 B | 9/1999 |
| JP | 2001351980 A | 12/2001 |
| JP | 2002043130 A | 2/2002 |
| JP | 2006173145 A | 6/2006 |

* cited by examiner

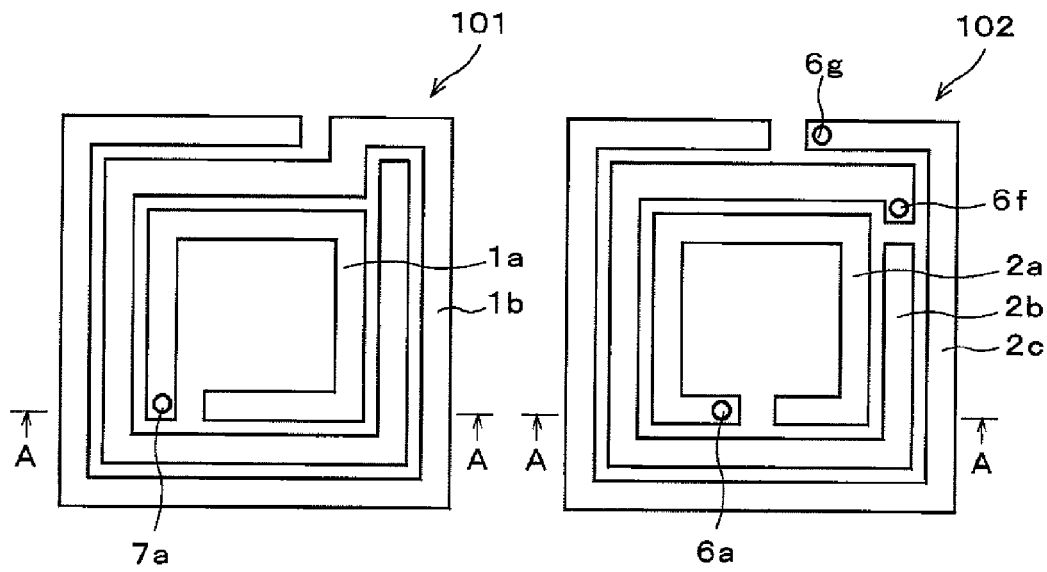
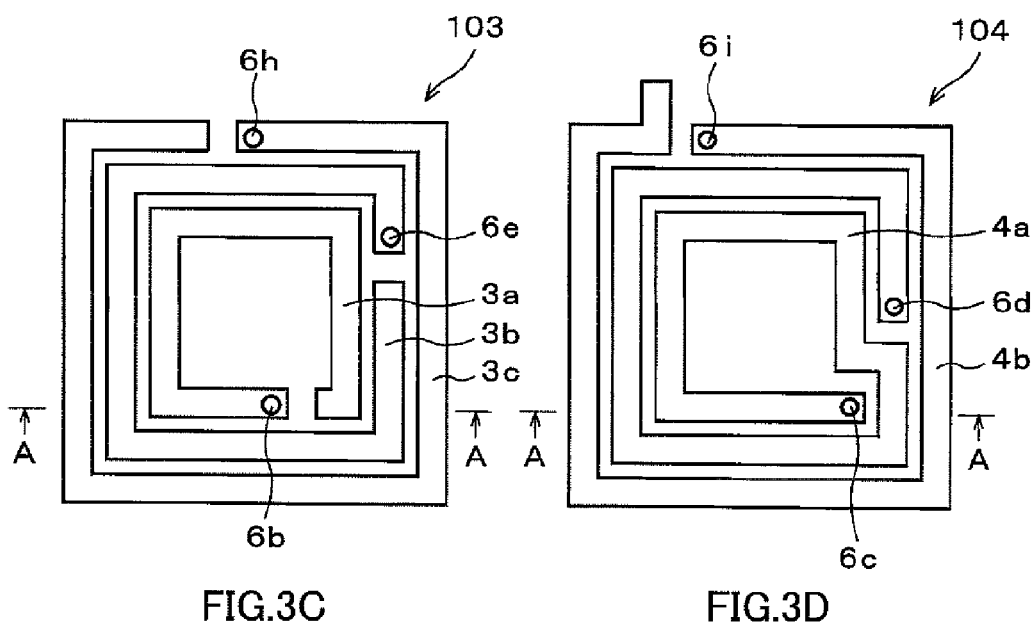

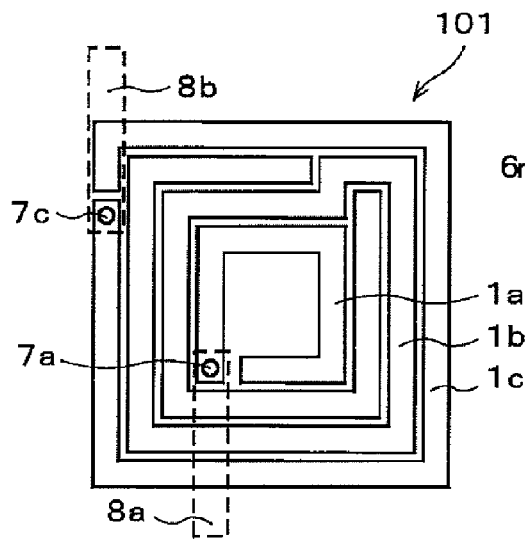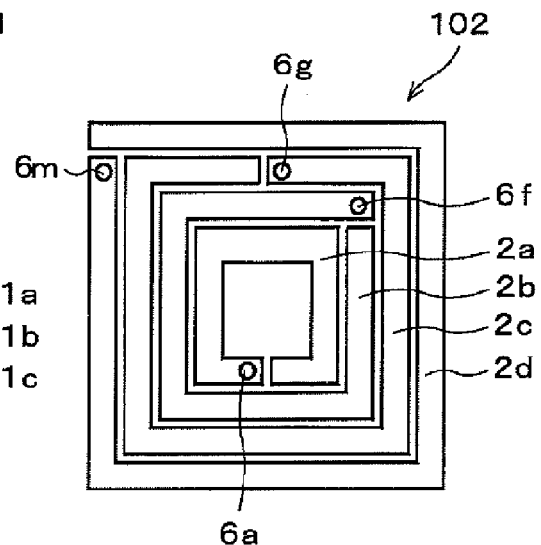
FIG.11A    FIG.11B
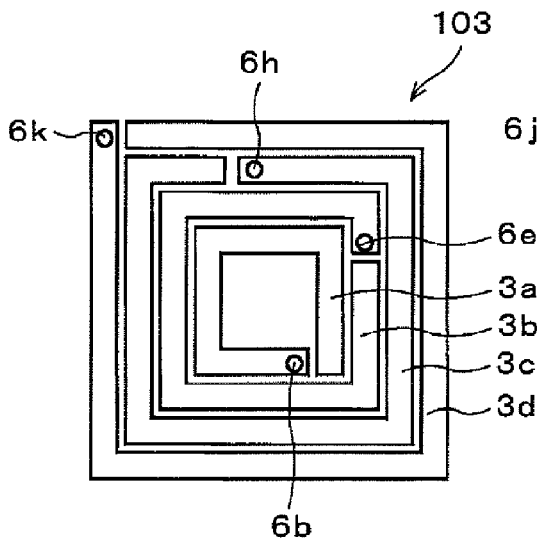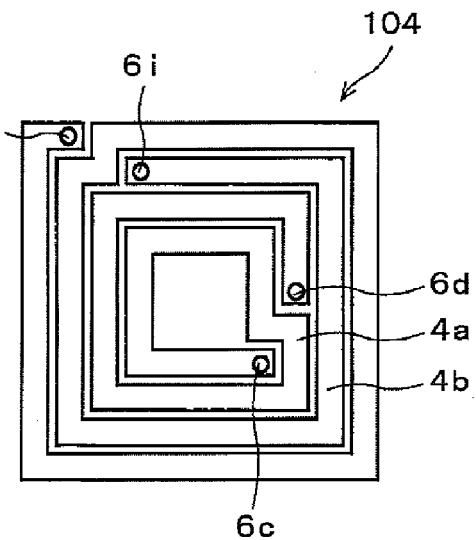
FIG.11C    FIG.11D

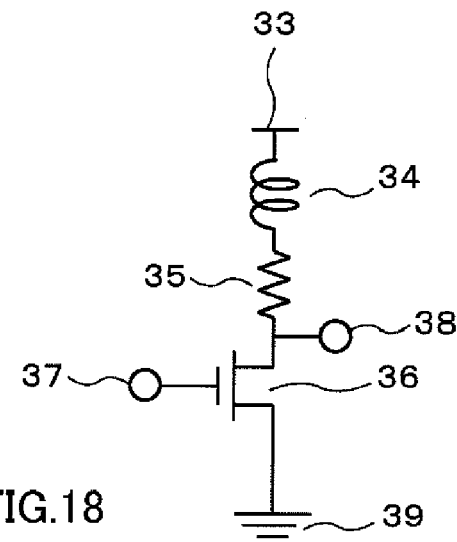
FIG.18
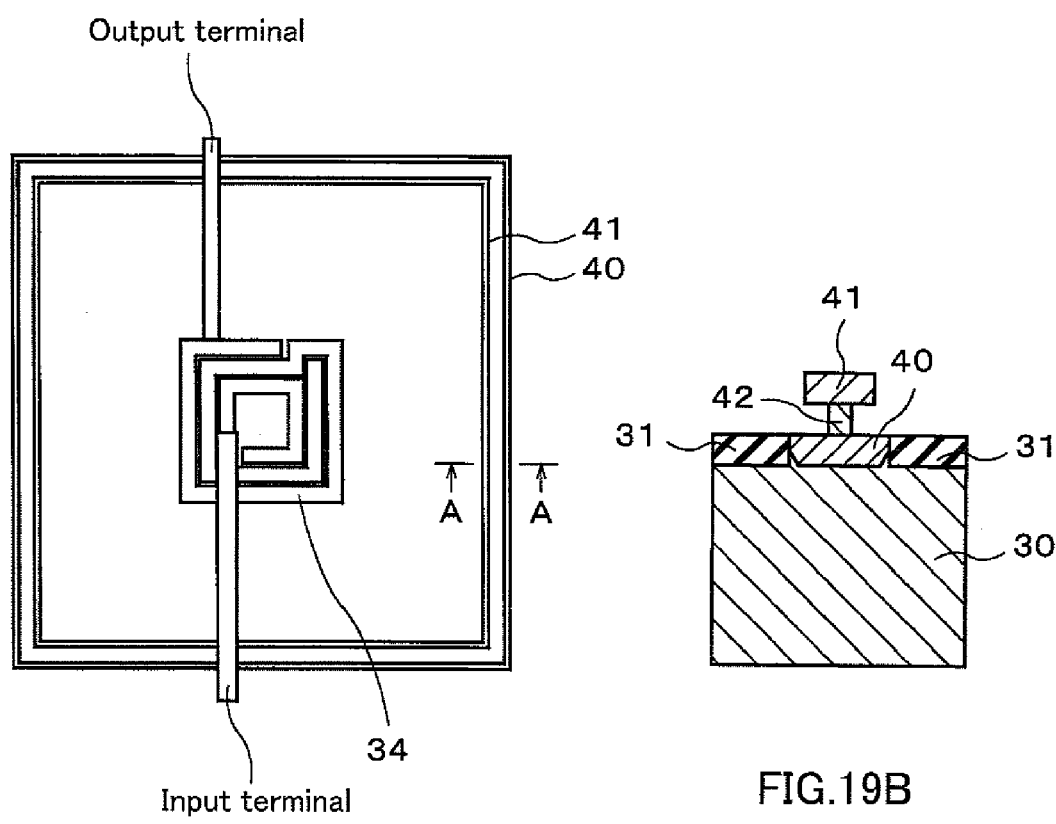
FIG.19A
FIG.19B

INDUCTOR ELEMENT, INDUCTOR ELEMENT MANUFACTURING METHOD, AND SEMICONDUCTOR DEVICE WITH INDUCTOR ELEMENT MOUNTED THEREON

INCORPORATION BY REFERENCE

This application is the National Phase of PCT/JP2007/065102, filed Aug. 1, 2007, which is based on Japanese Patent Application No. 2006-209915 filed on Aug. 1, 2006 and claims priority thereto; and the disclosure thereof is incorporated herein by reference in its entirety.

TECHNICAL FIELD

The present invention relates to an inductor element formed on a semiconductor substrate, a method for manufacturing the same, and a semiconductor device including the inductor element.

BACKGROUND ART

With the miniaturization and high integration of recent semiconductor elements, induction elements formed of metal leads, i.e., inductor elements, are formed in semiconductor devices with the goal of improving operation frequencies and achieving low noise/high stability.

Transistors, which are components of semiconductor devices, are undergoing performance improvement by miniaturization, high integration, and the like. However, the inductance of an inductor element is determined by a current flowing in a metal lead and a magnetic field created by the current; and therefore, when a circuit designer attempts to realize a desired inductance value, a chip surface area is necessary of at least several tens of μm by several tens of μm, and when large, several hundreds of μm by several hundreds of μm; and this results in an increase of the chip surface area and likewise causes an increase of the manufacturing cost of the semiconductor device. In other words, even in the case where a miniaturization is performed for structural elements of a semiconductor device including transistors and the like, the scaling, i.e., miniaturization, of an inductor element is difficult in principle; and therefore, the inductor element unfortunately results in a cost increase of the semiconductor device.

Further, in the case where a silicon substrate is used as a substrate that forms the semiconductor device, the performance of the inductor element deteriorates due to losses originating in the silicon substrate at the lower portion of the inductor element due to a high conductivity and a high relative dielectric constant of the silicon substrate. This mainly appears as a lower self-resonant frequency due to a parasitic capacitance between the metal lead forming the inductor element and the silicon substrate.

Also, for a semiconductor device using metal leads made of copper and having copper as a main component that are formed by a recently mainstream damascene process, a flattening process is performed for retaining the planarity of the inter-layer insulative film; and therefore, it is necessary to lay island shaped metal (hereinbelow, referred to as "dummy metal") also in the regions where metal leads are not formed; but the dummy metal exists between inductor leads and the silicon substrate; and thereby, the practically effective distance between the inductor leads and the silicon substrate is reduced by the amount of the thickness of the dummy metal; and as a result, the parasitic capacitance unfortunately increases.

To solve these problems, for example, technology disclosed in Patent Literature 1, Patent Literature 2, and Patent Literature 3 forms inductor elements by forming a spiral inductor in each layer of laminated multiple lead layers and connecting the spiral inductor of each lead layer in series, and thereby improves the inductance per unit surface area. FIG. 22 is a schematic perspective view of an essential portion of a semiconductor device disclosed in Patent Literature 1; FIG. 23A is a schematic top view illustrating a spiral inductor of a layer below a semiconductor device disclosed in Patent Literature 2; FIG. 23B is a schematic top view illustrating a spiral inductor of an upper layer of the same; and FIG. 24 is a schematic top view illustrating a spiral inductor of a semiconductor integrated circuit disclosed in Patent Literature 3.

As illustrated in FIG. 22 to FIG. 24, in the case where an inductor element is formed by making a spiral inductor using two lead layers and connecting these in series, about twice the inductance value can be obtained in comparison to an inductor element formed using a single lead layer having the same surface area.

Also, in Patent Literature 4 and Patent Literature 5, a solenoid shaped inductor element, which is formed by laminating annular leads that have a notch in a portion and mutually connecting these in series, is disclosed.

FIG. 25A is a schematic top view from a second lead 52 side of a semiconductor device disclosed in Patent Literature 6; and FIG. 25B is a schematic bottom view from a first lead 51 side (semiconductor substrate side) of the same. Technology disclosed in Patent Literature 6 reduces a signal delay between the upper and lower leads of the inductor element formed by two layers of metal leads, i.e., the first lead 51 and the second lead 52, and inhibits a decrease of the inductance value due to a negative mutual inductance.

Patent Literature 1: Unexamined Japanese Utility Model Application Publication No. S60-136156
Patent Literature 2: Unexamined Japanese Patent Application KOKAI Publication No. S61-265857
Patent Literature 3: Unexamined Japanese Patent Application KOKAI Publication No. H03-089548
Patent Literature 4: Unexamined Japanese Patent Application KOKAI Publication No. 2001-351980
Patent Literature 5: Unexamined Japanese Patent Application KOKAI Publication No. H06-61058
Patent Literature 6: U.S. Pat. No. 2,976,926

DISCLOSURE OF INVENTION

However, the conventional art described above has problems as illustrated hereinbelow. In the case where a currently widely utilized multiple layer lead structure is realized by the conventional art according to Patent Literatures 1 to 3, a major problem exists regarding a parasitic capacitance between leads. To describe specifically, with the miniaturization of recent semiconductor devices, a multiple layer metal lead formed on a semiconductor substrate often is formed by a metal thin film having a film thickness not more than 1 μm; and often, the distance between vertically laminated metal leads also is a spacing of not more than 1 μm.

FIG. 4 is a schematic cross-sectional view of an extracted portion of a multiple layer lead structure on a recently widely utilized semiconductor substrate. As illustrated in FIG. 4, first leads 1a and 1b having a fixed lead width w and lead height t are formed in a first lead layer 101; and second leads 2a and 2b having the fixed lead width w and lead height t are formed in a second lead layer 102 which is a layer below the first lead layer 101. An insulative film having a thickness h is provided between the first lead layer 101 and the second lead layer 102; the first leads 1a and 1b are formed adjacently and separated by an inter-lead distance s; and similarly, the second leads 2a and 2b are formed adjacently and separated by the inter-lead distance s. Further, the first lead 1a and the second lead 2a are formed adjacently and separated by an inter-lead distance h; and similarly, the first lead 1b and the second lead 2b are formed adjacently and separated by the inter-lead distance h.

As illustrated in FIG. 4, a lead capacitance 10a exists between the mutually adjacent first lead 1a and first lead 1b in the same lead layer; a lead capacitance 10b exists similarly between the second lead 2a and second lead 2b; a lead capacitance 11a exists between the mutually vertically adjacent first lead 1a and second lead 2a; and a lead capacitance 11b exists similarly between the first lead 1b and second lead 2b.

Among the spacing between leads illustrated in FIG. 4, spacing between mutually vertically adjacent leads, i.e., lead spacing between the first lead 1a and second lead 2a and between the first lead 1b and second lead 2b, is determined by a thickness h of the insulative film between the first lead layer 101 and the second lead layer 102; and the thickness h is determined at a fixed value by constraints of the manufacturing process of the semiconductor device. Accordingly, the circuit designer of the semiconductor device cannot freely determine the spacing between mutually vertically adjacent leads. On the other hand, the circuit designer can freely determine the spacing between mutually adjacent leads in the same lead layer, i.e., the lead spacing s between the first lead 1a and first lead 1b and between the second lead 2a and second lead 2b; but the permitted minimum spacing is determined by constraints of the manufacturing process. Also, the lead width w of the lead of the inductor element is determined from the aspect of series resistance of the inductor element and electromigration resistance.

In the case where a laminated inductor element of the conventional art disclosed in Patent Literatures 1 to 3 is configured, the design constraints described above are problematic. In other words, to realize a lead having a series resistance value commensurate with the circuit that the circuit designer designs and sufficient electromigration resistance, in the case where the lead width w of the first leads 1a and 1b and the second leads 2a and 2b is formed not less than a fixed lead width, as illustrated in FIG. 4, the capacitances 11a and 11b between mutually vertically adjacent leads unfortunately are larger than the capacitances 10a and 10b between mutually adjacent leads in the same lead layer.

In other words, for a structure in which an inductor element is formed by connecting vertically laminated multiple spiral inductors in series as in the conventional art disclosed in Patent Literatures 1 to 3, in the case where a parasitic capacitance between mutually vertically adjacent leads is larger than a parasitic capacitance between mutually adjacent leads in the same lead layer, and in the case where an upper layer lead is an input terminal and a lower layer lead is an output terminal, a large parasitic capacitance occurs between the input and output terminals. As a result, the apparent parasitic capacitance between the input and the output, i.e., the parasitic capacitance of the entire inductor element, becomes large; results in a narrow frequency band of the semiconductor device in which the inductor element is formed, etc.; causes performance deterioration; and particularly in the case where the operation frequency is high, causes the performance of the semiconductor device to greatly deteriorate.

Also, in the case where, for example, the distance between vertically laminated spiral inductors is formed sufficiently large to solve the problem that the capacitances 11a and 11b between mutually vertically adjacent leads are larger than the capacitances 10a and 10b between mutually adjacent leads in the same lead layer, another inductor lead cannot be formed in a lead layer between multiple inductors; and therefore, the surface area efficiency of the inductor element unfortunately declines.

Further, in the case where a damascene process is used as a lead formation method, island shaped dummy metal is laid also in regions in which leads are not formed; and in the case where dummy metal exists between multiple inductor leads, the parasitic capacitance between leads occurring between multiple inductors is large; and unfortunately, the performance of the inductor element deteriorates.

Additionally, according to the conventional art disclosed in Patent Literature 3, to reduce the parasitic capacitance between mutually vertically adjacent leads, the upper and lower leads are disposed not to overlap when projected onto a plane; but according to studies of the present inventors, even in the case where the upper and lower leads are disposed not to overlap when projected onto a plane, lines of electric force occur between these leads; and the reduction effects for particularly large parasitic capacitances cannot be obtained. Further, to dispose the upper and lower leads to not overlap when projected onto a plane, the spacing between the leads must be given a width equivalent to or not less than the lead width of the lead; and therefore, a new problem occurs in that the surface area of the inductor element increases.

Also, in Patent Literature 4, as a part of an LC filter formed for high frequency noise inhibition, a structure in which a solenoidal structure surrounds a columnar structure such as a magnetic material, etc., is disclosed; but no particular attention is given to reducing the inductance value of the inductor element realized by the structure and the parasitic capacitance that deteriorates the performance of the inductor element.

In Patent Literature 4, increasing lead layers forming the solenoid coil or increasing the cross-sectional area of the solenoid coil is recited as a method that increases the inductance value of the inductor element; but generally, the number of lead layers of the semiconductor device has constraints of manufacturing costs and the design environment and the like; and it is exceedingly difficult to increase the number of lead layers only for the inductor element. Also, in the case where the inductance value of the inductor element is increased by increasing the cross-sectional area of the solenoid coil, the surface area that the inductor element occupies in the semiconductor device increases; and further, the flux leakage to surroundings becomes large as the inductor element becomes large; and therefore, negative effects of signal interference and the like also unfortunately are exerted on other adjacent inductor elements and leads.

Also, in the case where an inductor element having a large surface area is formed, large parasitic capacitance occurs between the inductor element and the semiconductor substrate and causes a performance deterioration of the inductor element. As a result, for a semiconductor device that processes high speed logic signals, analog signals, and the like such as, for example, an amplifier and a transmitter, the designer unfortunately cannot obtain the desired sufficient inductance value.

Further, a structure in which a columnar structure at the center of a solenoid structure is positioned horizontally with respect to the semiconductor substrate also is disclosed in Patent Literature 4; but according to the structure, the thickness of general semiconductor devices is, as described above, at most several μm due to the miniaturization of recent semiconductor devices; and therefore, to obtain a sufficient inductance value, multiple leads disposed in a solenoidal shape are necessary; and as a result, the surface area that the inductor element occupies unfortunately becomes extremely large.

On the other hand, in Patent Literature 5, an inductor element formed by connecting in series annular leads having a notch in a portion is disclosed. The inductor element has a configuration nearly the same as that of Patent Literature 4, and therefore has problems similar to those of Patent Literature 4. In other words, in Patent Literature 5, it is necessary to increase the number of lead layers to increase the inductance value of the inductor element; but according to the description above, generally, the number of lead layers of the semiconductor device has constraints of manufacturing costs and the design environment and the like; and it is unfortunately exceedingly difficult for the designer to determine the number of lead layers.

In other words, in the case where the inductance value is increased in the conventional art disclosed in Patent Literatures 4 and 5, it is necessary to laminate the annular leads into multiple layers. The number of lead layers actually used in the semiconductor device, according to the description above, is limited; and in the conventional art disclosed in Patent Literatures 4 and 5, the obtained inductance value is limited by the number of lead layers and the surface area that the inductor element occupies. In the case where the diameter of the annular leads is supposedly made larger to obtain a larger inductance value, a large parasitic capacitance occurs between the inductor element and the semiconductor substrate; and unfortunately, the performance of the inductor element greatly deteriorates.

Further, in the conventional art disclosed in Patent Literatures 4 and 5, there is no consideration of the inter-lead capacitance that is a factor in the performance deterioration of the inductor element. In other words, a solenoid coil shaped inductor element is formed by a limited number of lead layers; and therefore, no consideration is given to a reduction method of the parasitic capacitance occurring in the case where the annular lead forms multiple winds in the same lead layer; and it is unfortunately difficult to realize an inductor element achieving both a reduction of surface area and a reduction of parasitic capacitance.

On the other hand, in technology disclosed in Patent Literature 6 illustrated in FIG. 25, a signal propagation time between the vertically adjacent first lead 51 and second lead 52 is shortened; and thereby, an interaction between leads is made smaller; and it is possible to improve the high frequency characteristic of the inductor element. However, in this conventional art, the number of layers of leads forming the inductor element is only two layers; and therefore, it is necessary to provide draw out leads that draw out input and output terminals of the inductor element to an exterior region of the element; it is necessary to dispose the leads of the inductor element to avoid the draw out leads; and layout constraints exist. Due to the layout constraints, as illustrated in FIG. 25, leads in which current flows in-phase cannot be disposed adjacent to each other; and therefore, the mutual inductance between adjacent leads is small; and as a result, the surface area efficiency unfortunately declines. By such layout constraints, a large chip surface area is necessary to obtain the desired inductance value; and unfortunately, the surface area efficiency declines.

Also, in the technology disclosed in Patent Literature 6, no consideration is given to an inter-lead capacitance that becomes a factor in the performance deterioration of the inductor element. In other words, a solenoid coil shaped inductor element is formed by a limited number of lead layers; and therefore, no consideration is given to a reduction method of the parasitic capacitance occurring in the case where a lead forms multiple winds in the same lead layer; and it is unfortunately difficult to realize an inductor element achieving both a reduction of surface area and a reduction of parasitic capacitance.

The present invention was conceived in consideration of the relevant problems, and is directed to provide an inductor element having reduced unintended parasitic capacitance and high performance, a manufacturing method thereof, and a semiconductor device including the inductor element.

An inductor element according to the present invention formed in a multiple layer lead structure comprising a lead, an insulative layer that insulates leads above and below, and a via provided in the insulative layer and connecting leads above and below wherein lead layers are multiply laminated layers, is characterized in that: at least a portion of at least a pair of vertically adjacent leads are coiled leads; the coiled leads are connected in series, wherein current directions of vertically adjacent coiled leads are the same by a via provided on an end portion thereof, and form a serial inductance; and an inter-lead capacitance of the vertically adjacent coiled leads is larger than an inter-lead capacitance between other coiled leads formed in the same lead layer.

Thereby, the most dominant parasitic capacitance of the parasitic capacitances that cause a deterioration of the high frequency characteristic of the inductor element is created between the input and output terminals and leads positioned directly below or directly above the input and output terminals; and thereby, the apparent parasitic capacitance of the entire inductor element can be reduced.

Also, the vertically adjacent coiled leads are provided in not less than three lead layers; and not less than three layers of the coiled leads may be connected in series by the via to make flow directions of currents the same.

It is favorable that a lead width of the coiled leads is larger than a lead height of the coiled leads.

Further, it is favorable that spacing between other coiled leads formed in the same lead layer is equal to or larger than spacing between the vertically adjacent coiled leads.

It is favorable that an effective relative dielectric constant of an insulative film that insulatively separates leads of the vertically adjacent coiled leads is larger than an effective relative dielectric constant of an insulative film that insulatively separates other coiled leads formed in the same lead layer.

In the inductor element according to the present invention, at least one of the coiled leads comprises a shape having two winds; a coiled lead other than the coiled lead having two winds comprises a shape having one wind; and at least two coiled leads comprising the one-wind shape may be formed in the same lead layer.

Additionally, it is favorable that the inductor element according to the present invention is formed by at least two layers of coiled leads.

At least one of the coiled leads positioned in the uppermost layer may comprise a shape having two winds in the same lead layer.

Also, at least one of the coiled leads positioned in the lowermost layer may comprise a shape having two winds in the same lead layer.

All of the lead heights of the coiled leads may be substantially the same.

In the inductor element according to the present invention, it is favorable that at least one of draw out leads connected to an end portion of the coiled lead for electrically connecting to an external element is formed in a lead layer different than a lead layer wherein the coiled lead is formed.

Thereby, it is no longer necessary to form the coiled lead to avoid the draw out lead; and therefore, the leads can be disposed with high density; and thereby, it is possible to reduce the surface area that the inductor element occupies and realize an inductor element having a high surface area efficiency.

Also, at least one of draw out leads connected to an end portion of the coiled lead for electrically connecting to an external element may be formed by an elongation of any lead positioned at an outermost circumference of the coiled lead.

It is favorable that distances between other coiled leads formed in the same lead layer are all substantially the same in the same lead layer.

Thereby, leads forming an inductor element can be disposed with high density, and therefore an inductor element occupying a small surface area can be formed. Further, in the case where the inter-lead distance of adjacent leads in the same lead layer are disposed proximally, the mutual inductance is large; and therefore, the surface area efficiency of the inductor element can be improved. Thereby, magnetic energy can be efficiently accumulated; and it is possible to inhibit magnetic signal interference to adjacent elements.

Also, the coiled lead may have a slit.

Further, the draw out lead may have a slit.

In the inductor element according to the present invention, it is favorable that dummy metal is multiply formed in a lead layer wherein the coiled leads are formed, and a density of the dummy metal of a side proximal to the coiled leads is lower than a density of the dummy metal of a side distal to the coiled leads.

Additionally, it is favorable that dummy metal is multiply formed in a lead layer positioned in a layer above or below a lead layer wherein the coiled leads are formed, and a density of the dummy metal of a side proximal to the coiled leads is lower than a density of the dummy metal of a side distal to the coiled leads.

An inductor element manufacturing method according to the present invention comprises: a step that forms a lead layer wherein a coiled lead on an insulative film and a via that connects coiled leads are provided; a step that laminates lead layers wherein an inter-lead capacitance of the vertically adjacent coiled leads is larger than an inter-lead capacitance between other coiled leads formed in the same lead layer; and a step that forms a draw out lead for electrically connecting the coiled lead to an external element.

A semiconductor device according to the present invention comprises the inductor element described above.

EFFECT OF THE INVENTION

According to the present invention, the most dominant parasitic capacitance of the parasitic capacitances that cause a deterioration of the high frequency characteristic of the inductor element is created between the input and output terminals and leads positioned directly below or directly above the input and output terminals; and thereby, the unintended parasitic capacitance of the inductor element can be reduced; and the apparent parasitic capacitance of the entire inductor element can be reduced. Thereby, the high frequency characteristic of the semiconductor device including the inductor element can be improved.

BRIEF DESCRIPTION OF DRAWINGS

FIG. 2B similarly is a schematic top view illustrating a second lead 2a; FIG. 2C similarly is a schematic top view illustrating a third lead 3a; and FIG. 2D similarly is a schematic top view illustrating a fourth lead 4a.

FIG. 3A is a schematic top view illustrating first leads formed in a first lead layer 101; FIG. 3B is a schematic top view illustrating second leads formed in a second lead layer 102; FIG. 3C is a schematic top view illustrating third leads formed in a third lead layer 103; and FIG. 3D is a schematic top view illustrating fourth leads formed in a fourth lead layer 104.

FIG. 11A is a schematic top view illustrating first leads formed in the first lead layer 101 of an inductor element according to a fourth exemplary embodiment of the present invention; FIG. 11B is a schematic top view illustrating second leads formed in the second lead layer 102 of the same; FIG. 11C is a schematic top view illustrating third leads formed in the third lead layer 103 of the same; and FIG. 11D is a schematic top view illustrating fourth leads formed in the fourth lead layer 104 of the same.

FIG. 18 is a circuit diagram of the semiconductor device according to the ninth exemplary embodiment of the present invention.

FIG. 19A is a schematic top view of an extracted essential portion of a semiconductor device according to a tenth exemplary embodiment of the present invention; and FIG. 19B is a cross-sectional view along line A-A of FIG. 19A.

Figure 1:
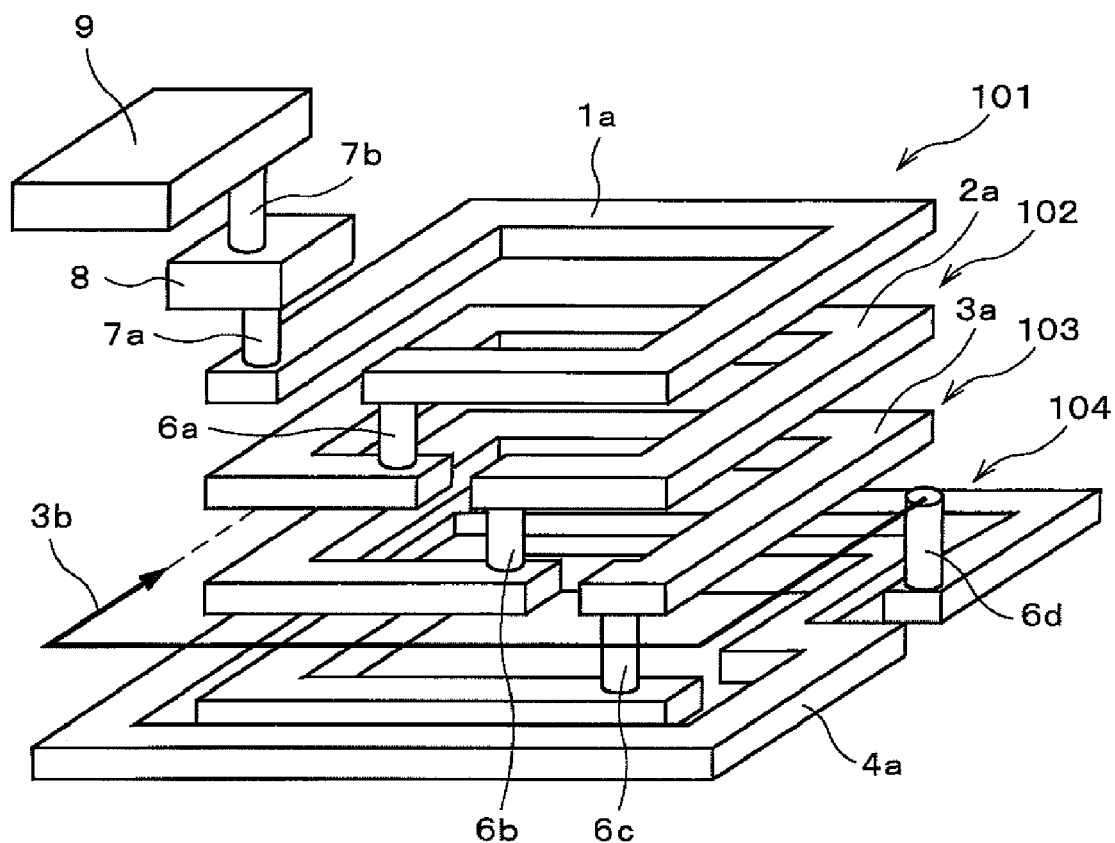
FIG. 1 is a schematic perspective view illustrating an inductor element according to a first exemplary embodiment of the present invention.

DESCRIPTION OF THE REFERENCE NUMERALS 1a, 1b, 1c, 51: First leads
2a, 2b, 2c, 2d, 52: Second leads
3a, 3b, 3c, 3d: Third leads
4a, 4b: Fourth leads
5a, 5b, 5c: Slits
6a to 6m, 7a to 7c: Vias
8, 8a: First draw out leads
8b, 9: Second draw out leads
10: Insulative film
11: Lower layer insulative film
12: Lead groove
13: Metal film
20a, 20b, 21a, 21b: Dummy metal groups
22: Region directly above which an inductor lead is formed
30: Semiconductor substrate
31: Element separation insulative film
32: Inter-layer insulative film
33: Power supply lead
34: Inductor element 35: Resistance element
36: Transistor
37: Input terminal
38: Output terminal
39: Grounding lead
40: Diffusion layer
41: Metal lead
42: Contact
43: Notch
44, 45: Lead groups

BEST MODE FOR CARRYING OUT THE INVENTION

Next, exemplary embodiments of the present invention are described in detail with reference to the accompanying drawings. All of the accompanying drawings schematically illustrate exemplary embodiments of the present invention; and the dimensions of the structures according to the present invention are not prescribed by the proportions of the components of the drawings. First, a first exemplary embodiment of the present invention is described.

Figure 2A:
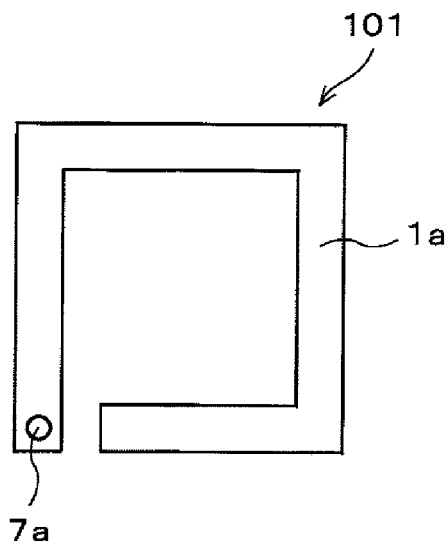
FIG. 2A is a schematic top view illustrating a first lead 1a illustrated in FIG. 1.
Figure 2B:
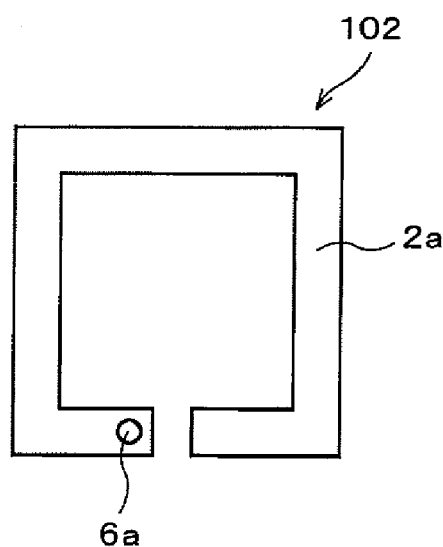
Figure 2C:
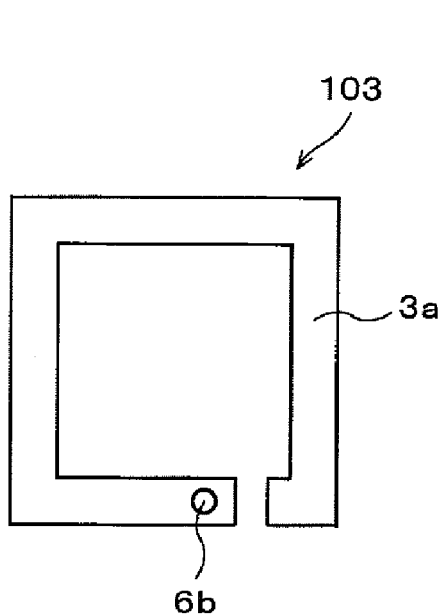
Figure 2D:
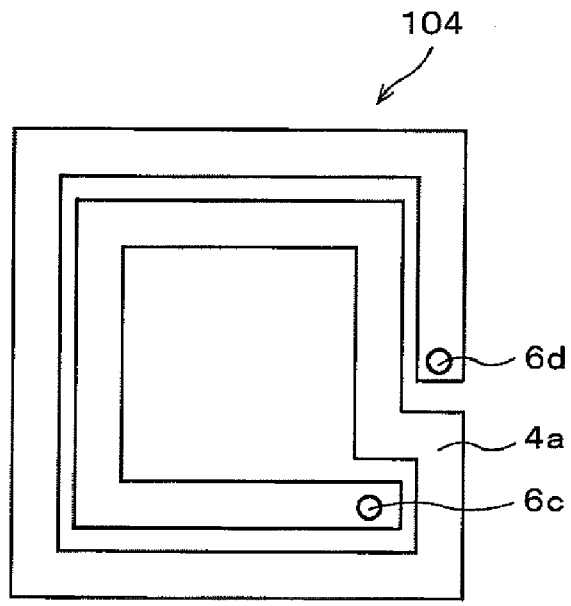
Figure 4:
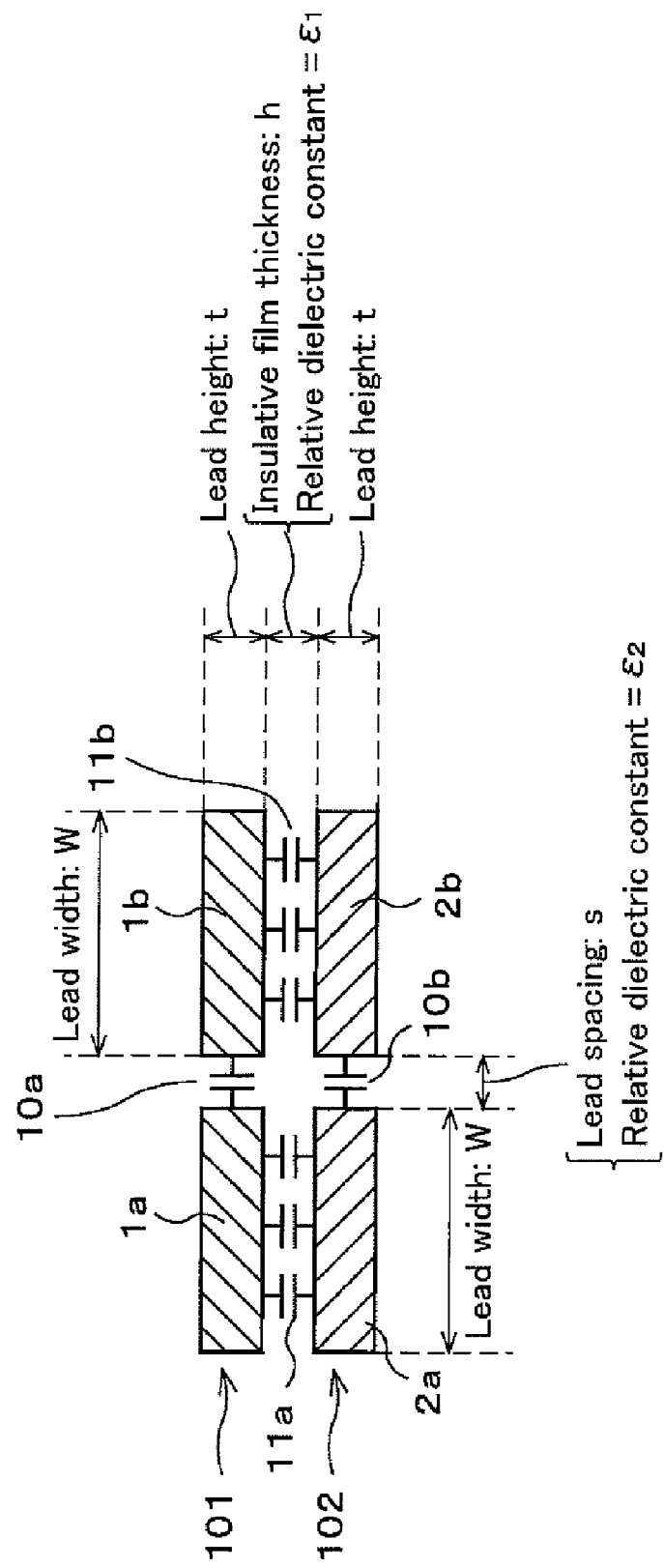
FIG. 4 is a schematic cross-sectional view of an extracted portion of a multiple layer lead structure on a semiconductor substrate.
Figure 5A:
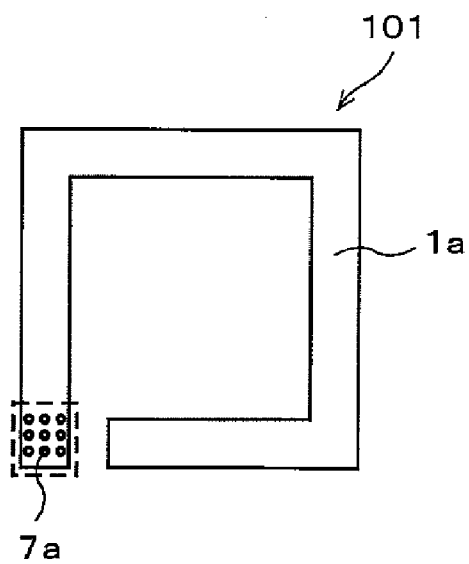
FIGS. 5A to D are schematic top views illustrating other embodiments of FIGS. 2A to D.
Figure 5B:
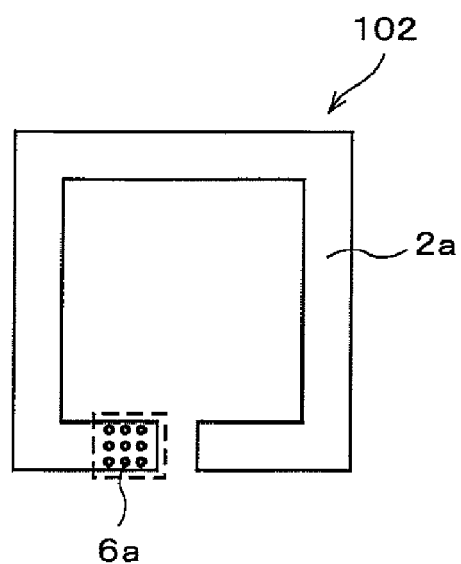
Figure 5C:
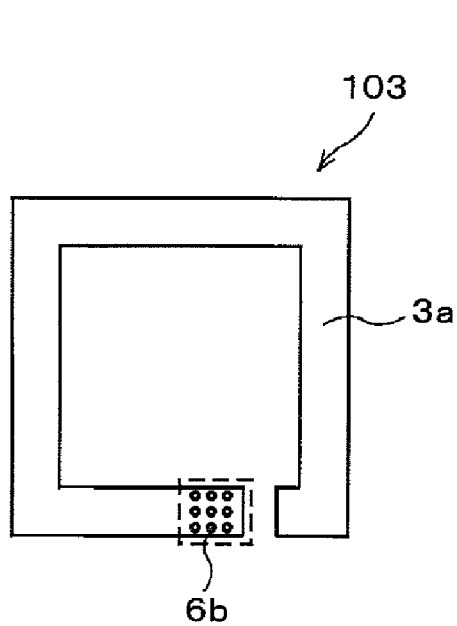
Figure 5D:
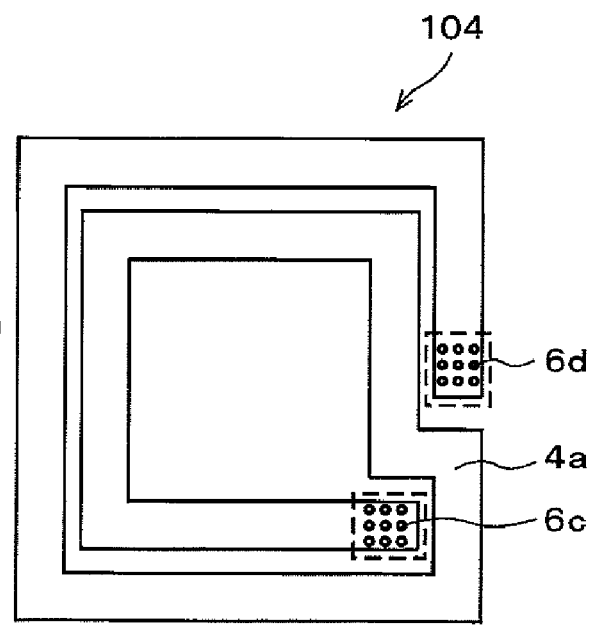
Figure 6:
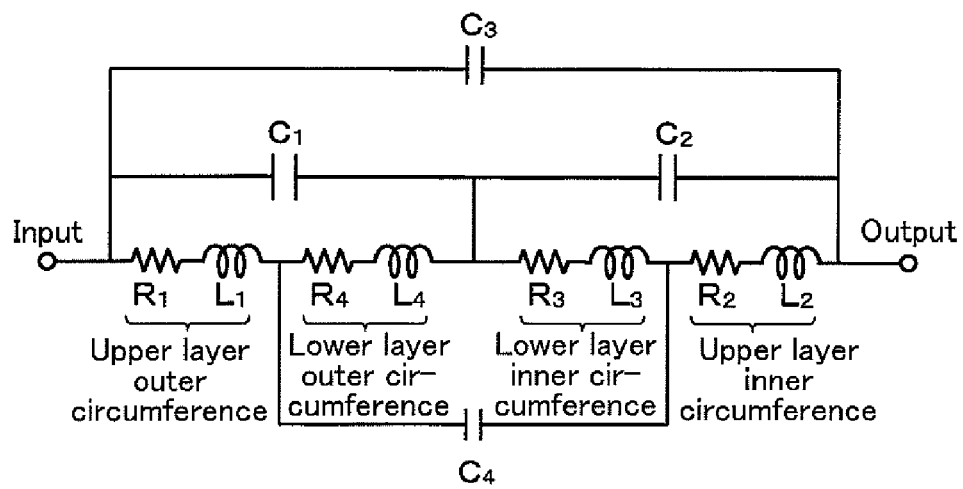
FIG. 6 is an equivalent circuit diagram of an inductor element according to this exemplary embodiment.
Figure 7:
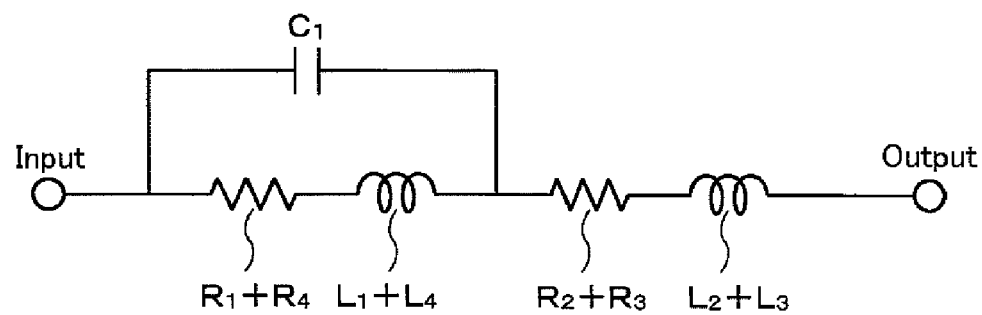
FIG. 7 is a rewritten equivalent circuit diagram of FIG. 6, wherein the magnitude relation of capacitances $C_1$, $C_2$, $C_3$, and $C_4$ is considered; $C_3$ and $C_4$ are sufficiently small in comparison to $C_1$ and therefore are ignored; and further, $C_2$ also is smaller than $C_1$ and is ignored.
Figure 8:
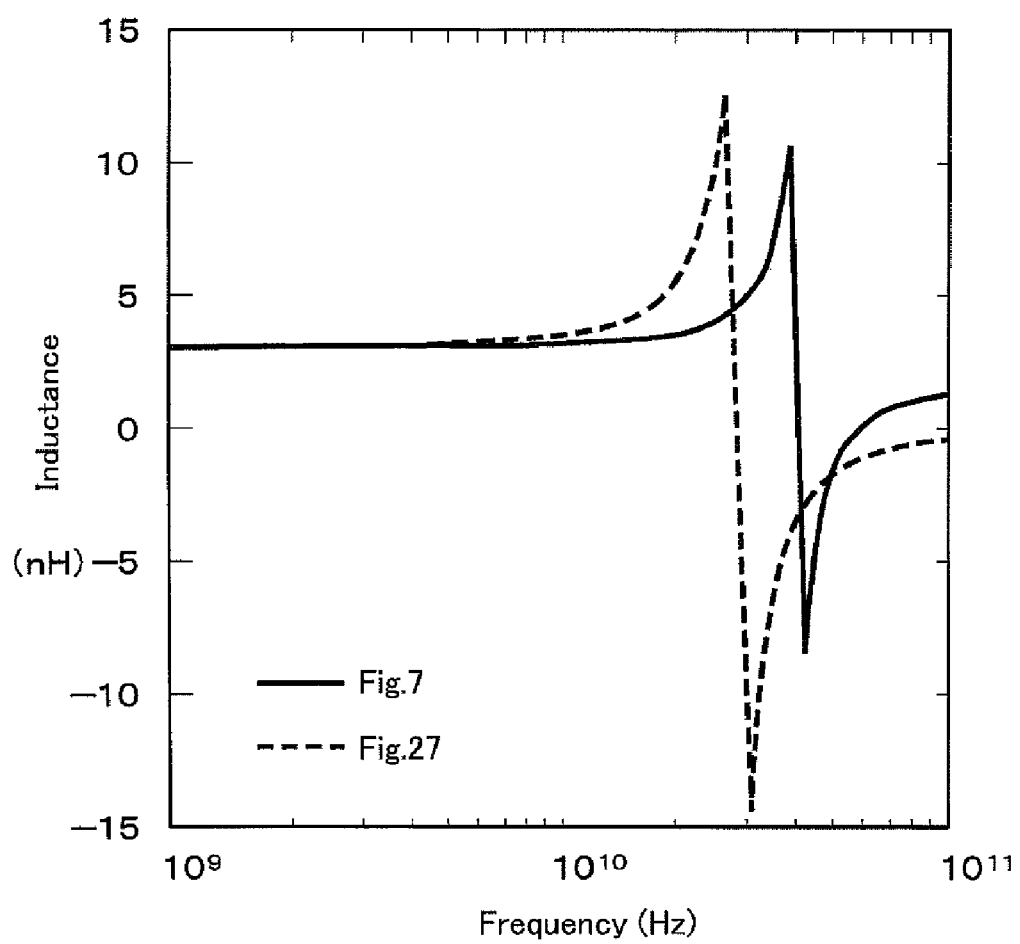
FIG. 8 is a graph illustrating the frequency dependence of an inductance between an input and an output of the inductor elements illustrated in FIG. 7 and FIG. 27, calculated from the total impedance between the input and the output of the equivalent circuit of each inductor element.
Figure 26:
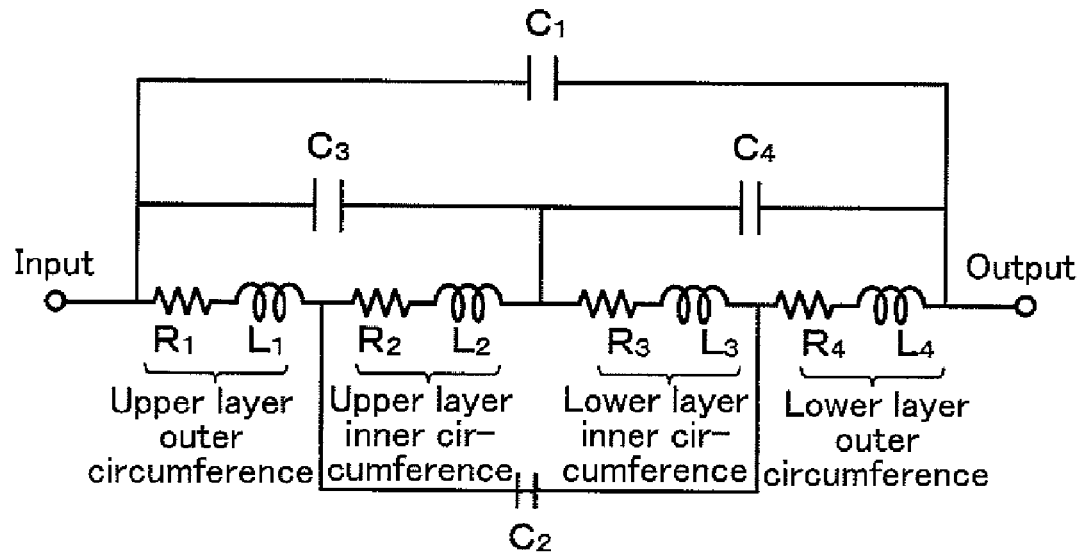
FIG. 26 is an equivalent circuit diagram of an inductor element of conventional art.
Figure 27:
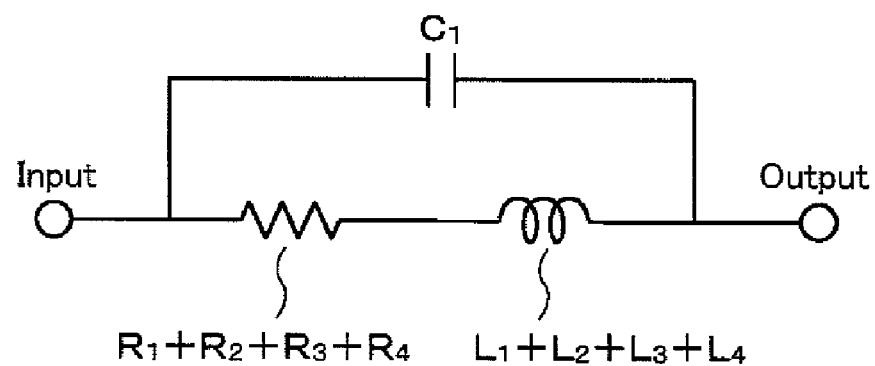
FIG. 27 is a rewritten equivalent circuit diagram of FIG. 26, wherein the magnitude relation of capacitances $C_1$, $C_2$, $C_3$, and $C_4$ is considered; $C_3$ and $C_4$ are sufficiently small in comparison to $C_1$ and therefore are ignored; and further, $C_2$ also is smaller than $C_1$ and is ignored.

FIG. 1 is a schematic perspective view illustrating an inductor element according to this exemplary embodiment; FIG. 2A is a schematic top view illustrating a first lead 1a illustrated in FIG. 1; FIG. 2B similarly is a schematic top view illustrating a second lead 2a; FIG. 2C similarly is a schematic top view illustrating a third lead 3a; FIG. 2D similarly is a schematic top view illustrating a fourth lead 4a; FIG. 3A is a schematic top view illustrating first leads formed in a first lead layer 101; FIG. 3B is a schematic top view illustrating second leads formed in a second lead layer 102; FIG. 3C is a schematic top view illustrating third leads formed in a third lead layer 103; FIG. 3D is a schematic top view illustrating fourth leads formed in a fourth lead layer 104; FIG. 4 is a schematic cross-sectional view of an extracted portion of a multiple layer lead structure on a semiconductor substrate; FIGS. 5A to D are schematic top views illustrating other embodiments of FIGS. 2A to D; FIG. 6 is an equivalent circuit diagram of an inductor element according to this exemplary embodiment; FIG. 7 is a rewritten equivalent circuit diagram of FIG. 6, wherein the magnitude relation of capacitances $C_1$, $C_2$, $C_3$, and $C_4$ is considered; $C_3$ and $C_4$ are sufficiently small in comparison to $C_1$ and therefore are ignored; and further, $C_2$ also is smaller than $C_1$ and is ignored; FIG. 8 is a graph illustrating the frequency dependence of an inductance between an input and an output of the inductor elements illustrated in FIG. 7 and FIG. 27, calculated from the total impedance between the input and the output of the equivalent circuits of each inductor element; FIG. 9 is a schematic cross-sectional view stepwise illustrating a method for manufacturing the inductor element according to this exemplary embodiment; FIG. 26 is an equivalent circuit diagram of an inductor element of conventional art; and FIG. 27 is an equivalent circuit diagram wherein FIG. 26 is rewritten similarly to FIG. 7.

As illustrated in FIG. 1 and FIG. 2, the fourth lead 4a of the inductor element according to this exemplary embodiment is wound roughly two winds in a coil shape having a spacing provided such that adjacent portions do not contact in the same plane in an insulative film (not illustrated) on a semiconductor substrate (not illustrated). Then, a via 6c is formed on a longitudinal direction end portion upper face of an inner side of the fourth lead 4a; and a via 6d is formed on a longitudinal direction end portion upper face of an outer side. Thereby, the fourth lead layer 104 is configured.

The via 6c is connected to one longitudinal direction end portion lower face of the coil shaped third lead 3a, which is formed in the third lead layer 103 positioned above the fourth lead layer 104 and has a notch in a portion; and a via 6b is formed on the other longitudinal direction end portion upper face of the third lead 3a.

The via 6b is connected to one longitudinal direction end portion lower face of the coil shaped second lead 2a, which is formed in the second lead layer 102 positioned above the third lead layer 103 and has a notch in a portion; and a via 6a is formed on the other longitudinal direction end portion upper face of the second lead 2a.

The via 6a is connected to one longitudinal direction end portion lower face of the coil shaped first lead 1a, which is formed in the first lead layer 101 positioned above the second lead layer 102 and has a notch in a portion; and a via 7a is formed on the other longitudinal direction end portion upper face of the first lead 1a. The via 7a is connected to a first draw out lead 8 formed in a lead layer positioned above the first lead layer 101; a via 7b is connected to the first draw out lead 8; and the via 7b is connected to a second draw out lead 9 formed in a lead layer positioned above the first draw out lead 8.

Also, the via 6d formed on the longitudinal direction end portion upper face of the outer side of the fourth lead 4a is connected to one longitudinal direction end portion lower face of a third lead 3b formed to surround the third lead 3a in the third lead layer 103. Similarly, a lead (not illustrated) is connected also to the other longitudinal direction end portion upper face of the third lead 3b by a via (not illustrated); and thereby, the inductor element according to this exemplary embodiment is formed. Here, the positions of the notches of the leads formed in each layer are different for each layer as illustrated in FIGS. 2A to D; and directions of current flowing in the coil shaped leads laminated vertically are the same. In FIG. 1, the third lead 3b is represented as an arrow; but the third lead 3b is a coil shaped lead having a notch in a portion similar to those of the first lead 1a to the third lead 3a. Also, for fear that the drawings would become complex and obstruct the understanding of the reader, the leads connected to the third lead 3b are omitted in the graphic representation of FIG. 1.

In the case where the inductor element according to this exemplary embodiment has four lead layers and three winds, as illustrated in FIG. 3D, a fourth lead 4b is formed to surround the fourth lead 4a in the fourth lead layer 104; a via 6i is formed on one longitudinal direction end portion upper face of the fourth lead 4b; and the other longitudinal direction end portion is positioned elongating in an outer side direction.

Additionally, as illustrated in FIG. 3C, the third lead 3b is formed to surround the third lead 3a in the third lead layer 103; and a via 6e is formed on a longitudinal direction end portion upper face of the third lead 3b that is not connected to the via 6d. Further, a third lead 3c is formed to surround the third lead 3b; and a via 6h is formed on a longitudinal direction end portion upper face of the third lead 3c that is not connected to the via 6i. Then, the via 6i formed on the fourth lead 4b is connected to a longitudinal direction end portion lower face of the third lead 3c on which the via 6h is not provided; and the via 6d formed in the fourth lead 4a is connected to a longitudinal direction end portion lower face of the third lead 3b on which the via 6e is not provided.

Also, as illustrated in FIG. 3B, a second lead 2b is formed to surround the second lead 2a in the second lead layer 102; and a via 6f is formed on one longitudinal direction end portion upper face of the second lead 2b. Further, a second lead 2c is formed to surround the second lead 2b; and a via 6g is formed on one longitudinal direction end portion upper face of the second lead 2c. The via 6e formed on the third lead 3b is connected to a longitudinal direction end portion lower face of the second lead 2b on which the via 6f is not provided; and the via 6h formed on the end portion upper face of the third lead 3c is connected to a longitudinal direction end portion lower face of the second lead 2c on which the via 6g is not provided.

Further, as illustrated in FIG. 3A, a first lead 1b is formed to wind roughly two winds to surround the first lead 1a in the first lead layer 101. The via 6f formed on the second lead 2b is connected to one longitudinal direction end portion lower face of the first lead 1b; and the via 6g formed on the end portion upper face of the second lead 2c is connected to the other longitudinal direction end portion lower face of the first lead 1b. Thereby, an inductor element having four lead layers and three winds, which are connected in series such that the orientations of the current that flows between mutually vertically adjacent leads are the same, is formed.

The inductor element according to this exemplary embodiment is formed such that the inter-lead capacitance between mutually vertically adjacent leads of the leads forming the inductor element is larger than the inter-lead capacitance between mutually adjacent leads in the same lead layer. In other words, the inductor element according to this exemplary embodiment has a configuration such that, for example, among the parasitic capacitances between leads that are determined by a lead width w and a lead spacing s of the first leads 1a and 1b and the second leads 2a and 2b as in the schematic cross-sectional view illustrated in FIG. 4, parasitic capacitances 11a and 11b between mutually vertically adjacent leads are larger than parasitic capacitances 10a and 10b between mutually adjacent leads in the same lead layer.

The inductor element according to this exemplary embodiment has a configuration wherein parasitic capacitances existing between mutually adjacent leads, not only for the first leads 1a and 1b and the second leads 2a and 2b, but also similarly for other mutually adjacent leads, have parasitic capacitances between mutually vertically adjacent leads that are larger than the parasitic capacitances between mutually adjacent leads in the same lead layer. The capacitance between mutually adjacent leads is prescribed by the lead height and the lead width of the inductor element, the distance between adjacent leads, and the effective relative dielectric constant of the insulative substance existing between mutually adjacent leads. Therefore, in FIG. 4, the condition wherein the parasitic capacitances 11a and 11b between mutually vertically adjacent leads become larger than the parasitic capacitances 10a and 10b between mutually adjacent leads in the same lead layer is represented by formula 1 below.

$$\varepsilon_1 \times \frac{w}{h} > \varepsilon_2 \times \frac{t}{s} \qquad \text{[Formula 1]}$$

Here, $\varepsilon_1$ is the relative dielectric constant of the insulative film formed between the first lead layer 101 and the second lead layer 102; h is the thickness of the insulative film of the same; w is the lead width of the first lead 1a, the first lead 1b, the second lead 2a, and the second lead 2b; t is the lead height of the same; $\varepsilon_2$ is the relative dielectric constant of the insulative film existing between the first lead 1a and the first lead 1b and between the second lead 2a and the second lead 2b; and s is the lead spacing between the first lead 1a and first lead 1b and between the second lead 2a and second lead 2b.

The inductor element illustrated in FIG. 4 has a configuration that satisfies formula 1 recited above, and therefore a reduction effect of the parasitic capacitance of the inductor element can be obtained.

As indicated in formula 1 recited above, it is favorable that the lead width (w) of the coiled lead is larger than the lead height (t) of the coiled lead. Also, it is favorable that the spacing (s) between other coiled leads formed in the same lead layer is equal to or larger than the spacing (h) to a vertically adjacent coiled lead. Further, it is favorable that the effective relative dielectric constant ($\in_1$) of the insulative film that insulatively separates mutually vertically adjacent coiled leads is larger than the effective relative dielectric constant ($\in_2$) of the insulative film that insulatively separates other coiled leads formed in the same lead layer.

Additionally, for the inductor element according to this exemplary embodiment, it is favorable that the parasitic capacitance between mutually vertically adjacent leads satisfies the condition of being larger than the parasitic capacitance between mutually adjacent leads in the same lead layer, and also that the mutually adjacent leads in the same lead layer are proximally disposed. Thereby, it is possible to make the mutual inductance between mutually adjacent leads in the same lead layer larger; and the surface area efficiency of the inductor element can be improved. Further, the surface area that the inductor element occupies can be reduced.

Further, for the inductor element according to this exemplary embodiment, it is favorable that each lead of the inductor element has substantially the same film thickness. Thereby, the symmetry as an element of the inductor element can be improved.

Furthermore, in this exemplary embodiment, all of the vias are graphically represented as single vias; but from the aspect of the reduction of the via resistance and the inhibition of electromigration, it is more favorable that these vias have, as an example, a configuration formed of multiple vias (multi-vias) as illustrated in FIGS. 5A to D. In this specification, hereinafter, to simplify notation, multiple vias are notated as single vias.

Hereinbelow, the principle of parasitic capacitance reduction of the inductor element according to this exemplary embodiment is described in detail with reference to the drawings.

FIG. 26 illustrates an equivalent circuit diagram of an inductor element according to the conventional art disclosed in Patent Literatures 1 to 3. FIG. 26 supposes, as the inductor element according to the conventional art, an inductor element having two winds using a two layer lead, which is the simplest structure. The leads of the inductor element illustrated in FIG. 26 are represented in the equivalent circuit illustrated in FIG. 26 as a structure in which a resistance $R_1$ and an inductance $L_1$ corresponding to an outer circumference of an upper layer lead, a resistance $R_2$ and an inductance $L_2$ corresponding to an inner circumference of the upper layer lead, a resistance $R_3$ and an inductance $L_3$ corresponding to an inner circumference of a lower layer lead, and a resistance $R_4$ and an inductance $L_4$ corresponding to an outer circumference of the lower layer lead are connected. Further, in FIG. 26, for the parasitic capacitances existing between the respectively subdivided leads, $C_1$ is a parasitic capacitance corresponding to the capacitance vertically between leads of the outer circumference, $C_2$ is a parasitic capacitance corresponding to the capacitance vertically between leads of the inner circumference, $C_3$ is a parasitic capacitance corresponding to a mutually adjacent inter-lead capacitance in the same lead layer for the upper layer, and $C_4$ is a parasitic capacitance corresponding to a mutually adjacent inter-lead capacitance in the same lead layer for the lower layer.

According to the multiple layer lead structure of currently mainstream miniaturized semiconductor devices as previously illustrated in FIG. 4, in the case where leads have a width not less than a fixed lead width, parasitic capacitances between mutually vertically adjacent leads are larger than mutually adjacent parasitic capacitances in the same lead layer. Accordingly, the magnitude relation of the parasitic capacitances $C_1$, $C_2$, $C_3$, and $C_4$ of the equivalent circuit illustrated in FIG. 26 that is supposed and written down for the inductor element according to the conventional art can be represented by formula 2 below in the case where the lead has a width not less than a fixed lead width.

$$C_1 > C_2 >> C_3 \text{-} C_4 \quad \text{[Formula 2]}$$

In other words, $C_1$ of the equivalent circuit diagram illustrated in FIG. 26 is the largest capacitance. In FIG. 26, the magnitude relation of the capacitances is represented by corresponding sizes of the circuit symbols.

On the other hand, the equivalent circuit diagram of the inductor element according to this exemplary embodiment illustrated in FIG. 6 supposes, as a solenoid inductor structure having multiple winds similarly to FIG. 26, an inductor element having two winds using a two layer lead, which is the simplest structure. The leads of the inductor element illustrated in FIG. 6 are represented in the equivalent circuit illustrated in FIG. 6 as a structure in which the resistance $R_1$ and the inductance $L_1$ corresponding to an outer circumference of the upper layer lead, the resistance $R_4$ and the inductance $L_4$ corresponding to an outer circumference of the lower layer lead, the resistance $R_3$ and the inductance $L_3$ corresponding to an inner circumference of the lower layer lead, and the resistance $R_2$ and the inductance $L_2$ corresponding to an inner circumference of the upper layer lead are connected. Further, in FIG. 6, for the parasitic capacitances existing between the respectively subdivided leads, $C_1$ is a parasitic capacitance corresponding to the capacitance vertically between leads of the outer circumference, $C_2$ is a parasitic capacitance corresponding to the capacitance vertically between leads of the inner circumference, $C_3$ is a parasitic capacitance corresponding to a mutually adjacent inter-lead capacitance in the same lead layer for the upper layer, and $C_4$ is a parasitic capacitance corresponding to a mutually adjacent inter-lead capacitance in the same lead layer for the lower layer.

According to the multiple layer lead structure of currently mainstream miniaturized semiconductor devices as previously illustrated in FIG. 4, in the case where the lead has a width not less than a fixed lead width, parasitic capacitances between mutually vertically adjacent leads are larger than mutually adjacent parasitic capacitances in the same lead layer. Accordingly, the magnitude relation of the parasitic capacitances $C_1$, $C_2$, $C_3$, and $C_4$ of the equivalent circuit illustrated in FIG. 6 that is supposed and written down for the inductor element of the semiconductor device according to this exemplary embodiment can be represented by formula 3 below in the case where the lead has a width not less than a fixed lead width.

$$C_1 > C_2 >> C_3 \text{-} C_4 \quad \text{[Formula 3]}$$

In other words, $C_1$ of the equivalent circuit diagram illustrated in FIG. 6 is the largest capacitance. In FIG. 6, the magnitude relation of the capacitances is represented by corresponding sizes of the circuit symbols.

For the equivalent circuit diagram of the inductor element of the conventional art illustrated in FIG. 26 and the equivalent circuit diagram of the inductor element according to this exemplary embodiment illustrated in FIG. 6, the sizes of the parasitic capacitances occurring between each lead are equivalent, but the connection positions in the equivalent circuits are different. In the equivalent circuit of the inductor element of the conventional art as illustrated in FIG. 26, the most dominant parasitic capacitance $C_1$ is placed between the input and the output of the inductor element; while in the equivalent circuit diagram of the inductor element according to this exemplary embodiment as illustrated in FIG. 6, the most dominant parasitic capacitance $C_1$ is placed between intermediate points of the leads of the input terminal and the inductor element.

Here, the magnitude relation of the capacitances $C_1$, $C_2$, $C_3$, and $C_4$ has the relation represented by formulas 2 and 3 recited above; and thereby, $C_3$ and $C_4$ are sufficiently small in comparison to $C_1$ and therefore are ignored; and further, by ignoring $C_2$ also as being smaller than $C_1$, the equivalent circuit of the inductor element of the conventional art illustrated in FIG. 26 becomes as illustrated in FIG. 27. Similarly, the equivalent circuit diagram of the inductor element according to this exemplary embodiment illustrated in FIG. 6 becomes as illustrated in FIG. 7.

As illustrated in FIG. 27, for the inductor element of the conventional art, the most dominant parasitic capacitance $C_1$ is placed between the input and output terminals of the inductor element. On the other hand, as illustrated in FIG. 7, for the inductor element according to this exemplary embodiment, the most dominant parasitic capacitance $C_1$ is placed not between the input and output terminals of the inductor element, but between intermediate points of the leads of the input terminal of the inductor element and the inductor element. Thereby, the inductor element according to this exemplary embodiment makes distal the dominant parasitic capacitance occurring between leads from the input and output terminals, and thereby reduces the apparent capacitance between the input and the output, i.e., of the entire inductor element.

In FIG. 8, the broken line represents the frequency dependence of the inductance between the input and the output of the inductor element of the conventional art; and the solid line represents the frequency dependence of the inductance between the input and the output of the inductor element according to this exemplary embodiment. FIG. 8 is obtained by assuming that the resistances $R_1+R_2+R_3+R_4=70\Omega$, the inductances $L_1+L_2+L_3+L_4=3$ nH, and the capacitance $C_1=10$ fF for the circuit constants of FIG. 27; and by assuming that the resistances $R_1+R_4=35\Omega$ and $R_2+R_3=35\Omega$, the inductances $L_1+L_4=1.5$ nH and $L_2+L_3=1.5$ nH, and the capacitance $C_1=10$ fF for the circuit constants of FIG. 7. As illustrated in FIG. 8, the frequency at which the inductance value abruptly increases is different for the circuit illustrated in FIG. 27 and the circuit illustrated in FIG. 7. As the frequency becomes high, a phenomenon in which the apparent inductance value abruptly becomes large is facilitated by a resonance phenomenon due to parasitic capacitance components; and a higher frequency at which the apparent inductance value becomes large indicates a smaller apparent parasitic capacitance between the input and the output. As illustrated in FIG. 8, the frequency at which resonance occurs for the equivalent circuit illustrated in FIG. 7 is higher than that of the equivalent circuit illustrated in FIG. 27; and thereby, it is shown that the configuration of the inductor element according to this exemplary embodiment reduces the contribution of apparent parasitic capacitance. By the principle hereinabove, the inductor element according to this exemplary embodiment reduces the apparent parasitic capacitance and improves high frequency characteristics.

For the inductor element of this exemplary embodiment, as illustrated in FIG. 1, the second draw out lead 9 for connecting the inductor element to an external element is formed in a different lead layer than the first lead layer 101 in which the first lead of the inductor element is formed, the second lead layer 102 in which the second lead is formed, the third lead layer 103 in which the third lead is formed, and the fourth lead layer 104 in which the fourth lead is formed; and therefore, it is not necessary to respectively form each lead of the inductor element to avoid the second draw out lead 9; and the degree of freedom of the layout of the leads is high. Thereby, it is possible to dispose leads of the inductor element proximal to each other; and the mutual inductance of leads adjacent to each other can be made large; and therefore, it is possible to make the inductance value large.

To inhibit a parasitic capacitance from forming between the second draw out lead 9 and the first lead to the fourth lead, it is favorable to dispose the second draw out lead 9 removed from the first lead to the fourth lead; but the disposition can be determined based on components such as the position of the external element connected to the inductor element configured according to the description above, a position of the lead layer in which a connection terminal of the external element exists, design constraints, constraints of the lead layers that can be used, and the like.

According to the configuration illustrated in this exemplary embodiment, the degrees of freedom of the position at which the draw out lead of the inductor element is formed is improved. For example, in the case where the number of winds of the inductor element is an even number, both of the draw out leads connecting to the inductor element can be formed at positions connecting to a lead of the upper layer or the layer below the inductor element. On the other hand, in the case where the number of winds of the inductor element is an odd number, one of the draw out leads of the inductor element can be formed at a position to connect from the upper layer, and the other can be formed at a position to connect from the lower layer.

This exemplary embodiment, as illustrated in FIG. 1, illustrates an example in which the number of winds of the solenoid shaped inductor element is three; and therefore, one of the draw out leads (the second draw out lead 9) is formed at a position to connect to the first lead 1a corresponding to the uppermost layer lead of the leads of the inductor element; and the other draw out lead, as illustrated in FIG. 4D, is formed by elongating the outermost circumferential lead of a fourth lead (the fourth lead 4b), corresponding to the lowermost layer lead of the leads of the inductor element, to the outer side.

Next, operations of the inductor element according to this exemplary embodiment having a configuration according to the description above are described. For the inductor element according to this exemplary embodiment, the parasitic capacitance between mutually vertically adjacent leads is larger than the parasitic capacitance between mutually adjacent leads in the same lead layer; and therefore, a reduction effect of the parasitic capacitance of the inductor element can be obtained. Also, at this time, by proximally disposing mutually adjacent leads in the same lead layer, it is possible to make the mutual inductance large between mutually adjacent leads in the same lead layer; the surface area efficiency of the inductor element can be improved; and the surface area that the inductor element occupies can be reduced. Further, in the case where each lead of the inductor element is formed to have the same film thickness, the symmetry as an element also can be improved.

In this exemplary embodiment, the element of the lead is not particularly limited; and the lead can be formed by using copper, which is a typical lead material, or an alloy having copper as a main component; or by using an element such as aluminum, gold, silver, or the like, or an alloy having main components thereof. The effects obtained by this exemplary embodiment are not particularly limited by the lead material.

Additionally, the lead material of the inductor element may be any material having electrical conductivity; and may be configured by a non-metal material such as, for example, a cylindrical carbon conductor having a diameter of several nm to several tens of nm and generally referred to as a carbon nanotube, bundles (sheaves) thereof, and the like. In other words, this exemplary embodiment utilizes an electromagnetic phenomenon surrounding the leads, and therefore is not particularly limited by the lead material and the presence/absence, material constant, etc., of substances surrounding the leads; and by the lead structure disclosed in this exemplary embodiment, the effects thereof can be obtained. Also, the material of the inductor element of this exemplary embodiment can be utilized without being particularly limited to a material of a semiconductor device, except that a material having an electrical conductivity is necessary.

Next, a method for manufacturing the inductor element according to this exemplary embodiment is described. The inductor element according to this exemplary embodiment has its characteristics in the structure of the inductor element formed by the leads; and therefore, there are no limitations thereof from characteristics due to the formation method of the leads. In other words, in the present invention, the effects of the present invention can be obtained by the structures illustrated in the exemplary embodiments of the present invention; and the formation method of the leads may be any method.

Hereinbelow, as an example of the method for manufacturing the inductor element according to this exemplary embodiment, a manufacturing method by a damascene process currently widely in practical use is described. FIG. 9, which illustrates the method for manufacturing the inductor element according to this exemplary embodiment, illustrates a lead formation method by a so-called damascene process that forms leads by making grooves in an insulative film deposited on a semiconductor substrate, filling a metal film such as copper into the groove portions, and then performing a flattening; but a hard mask film, an etching stopper film, and the like used in fabrication technology by the damascene process are not particularly illustrated.

Also, in the case where a lead manufactured by a damascene process is formed of copper or an alloy having copper as a main component, in many cases, the lead has a lead structure in which a metal is filled into the insulative film; and to prevent diffusion of the lead material into the insulative film, a layer generally referred to as barrier metal is formed in which, for example, a refractory metal such as titanium, tantalum, or the like, or a nitride thereof, or further, a laminate structural body, etc., thereof are formed on the bottom and side walls of the lead; but these do not exert a large effect on the structure of the inductor element according to this exemplary embodiment, and therefore are not particularly illustrated. Further, the barrier metal formed prior to the filling step of the metal, which is the lead material, also is not particularly illustrated. Additionally, a semiconductor substrate and semiconductor elements such as transistors formed on the semiconductor substrate, which are positioned further downward in the insulative film, are not illustrated.

Moreover, damascene process lead formation methods include a method referred to as a single damascene process that forms the leads and the vias for mutually connecting leads that are formed in different respective layers to each other in separate steps, and a method referred to as a dual damascene process that simultaneously forms leads and vias positioned in the layer below the leads; but either damascene process may be used as the method for manufacturing the inductor element according to this exemplary embodiment. The method for manufacturing the inductor element according to this exemplary embodiment described hereinbelow illustrates a lead formation method by a dual damascene process.

Figure 9A:
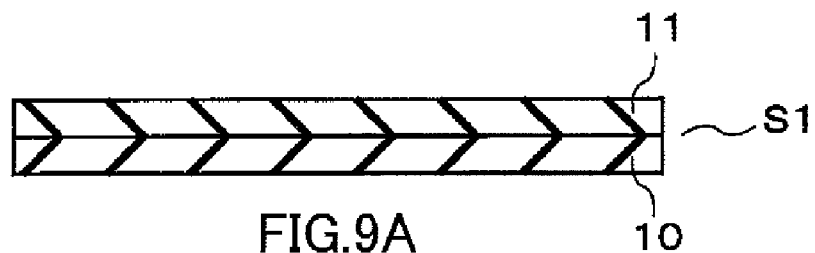
FIG. 9 is a schematic cross-sectional view stepwise illustrating a method for manufacturing the inductor element according to the first exemplary embodiment of the present invention.

First, as illustrated in FIG. 9A, an insulative film 11 corresponding to a layer forming leads 4a and 4b on a lower layer insulative film 10 deposited on a semiconductor substrate (not illustrated) is deposited by a known insulative film formation method such as chemical vapor deposition, an application method, or the like (step 1). The insulative film 11 is an insulative film that contains, for example, an element such as silicon, oxygen, hydrogen, fluorine, carbon, nitrogen, or the like; and the material of the insulative film 11 of this exemplary embodiment is not in particular limited; but to inhibit the parasitic capacitance between leads and the unintended parasitic capacitance between the leads and semiconductor substrate, it is favorable that the relative dielectric constant of the insulative film 11 is not more than the relative dielectric constant of a silicon oxidation film which is 4.2. Further, to inhibit the unintended parasitic capacitance between leads, it is more favorable that the insulative film 11 has minute voids having a diameter of not more than 3 nm in the interior of the insulative film 11. According to the fabrication method of the insulative film 11, the insulative film 11 may have a laminate structure of two or more types of insulative films having mutually different compositions.

Subsequently, in a step that laminates the lead layers, in the case where the lead formed directly below the insulative film 11 is copper or an alloy having copper as a main component, it is more favorable that the insulative film 11 has a laminate structure of insulative films containing at least silicon and carbon and having a copper diffusion resistance and insulative films that have minute voids. Thereby, it is possible to prevent the diffusion of copper into the interior of the insulative film 11, increase the reliability of the semiconductor device, and inhibit an increase of unintended parasitic capacitance.

Figure 9B:
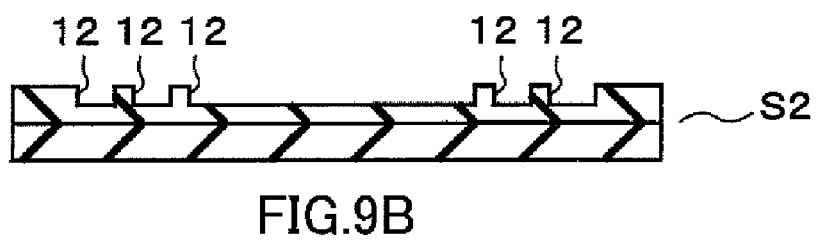

Next, as illustrated in FIG. 9B, a lead groove pattern 12 is formed for forming the leads 4a and 4b, for example, by a patterning method typified by photolithography and a fabrication method typified by reactive etching on the insulative film 11 (step 2). The pattern shape of the lead groove pattern 12 is a rectangular shape in this exemplary embodiment, but may be formed, for example, as an octagonal shape, a substantially round shaped polygonal shape, and the like. To make the surface area that the inductor element occupies smaller, a rectangular shape such as that illustrated in FIG. 3 is favorable. The shape of the lead groove pattern 12 may have a lead width, an inner diameter, an inter-lead space, a number of winds, and the like that are determined by the required performance of the finally obtained inductor element; and these dimensions are determined by the circuit designer of the semiconductor device. However, as described above, a formation is necessary such that the capacitance between mutually vertically adjacent leads is larger than the capacitance between mutually adjacent leads in the same lead layer.

Figure 9C:
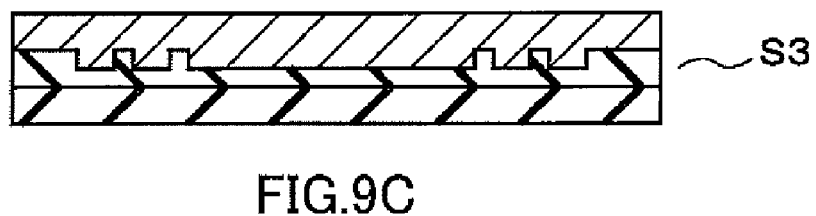

Next, as illustrated in FIG. 9C, a metal film 13 is deposited by a method such as sputtering, chemical vapor deposition, plating, or the like from above the lead groove pattern 12 (step 3).

Figure 9D:
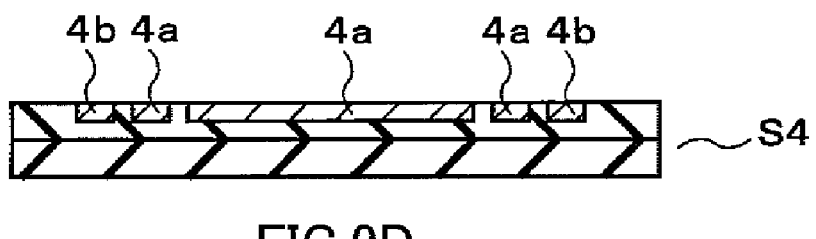

Next, as illustrated in FIG. 9D, excess portions of the deposited metal film 13 are removed by a flattening method typified by, for example, chemical mechanical polishing; and the fourth leads 4a and 4b are obtained (step 4). The schematic cross-sectional view illustrated in FIG. 9D is a cross-sectional view along line A-A of FIG. 3D.

Figure 9E:
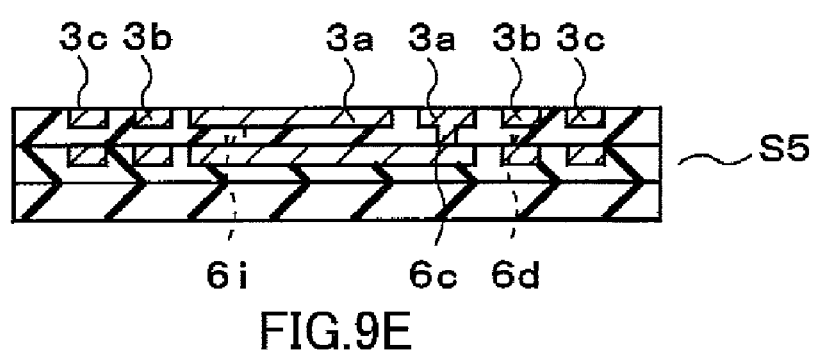

Next, as illustrated in FIG. 9E, similar to the formation method of the fourth leads 4a and 4b, the vias 6c, 6d, and 6i and the third leads 3a, 3b, and 3c are formed by a damascene process (step 5). The schematic cross-sectional view illustrated in FIG. 9E is a cross-sectional view along line A-A of FIG. 3C. The third lead 3a and the fourth lead 4a are electrically connected in series by the via 6c; the fourth lead 4a and the third lead 3b are electrically connected in series by the via 6d; and the fourth lead 4b and the third lead 3c are electrically connected in series by the via 6i.

Figure 9F:
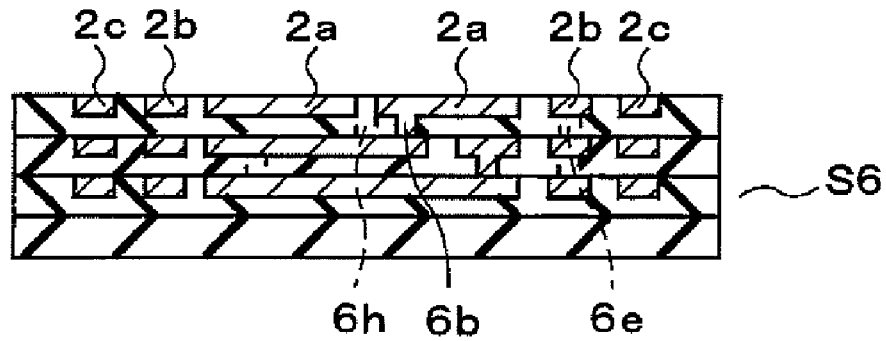

Next, as illustrated in FIG. 9F, similar to the formation method of the third leads 3a, 3b, and 3c and the vias 6c, 6d, and 6i, the vias 6b, 6e, and 6h and the second leads 2a, 2b, and 2c are formed by damascene process (step 6). The schematic cross-sectional view illustrated in FIG. 9F is a cross-sectional view along line A-A of FIG. 3B. The third lead 3a and the second lead 2a are electrically connected in series by the via 6b; the third lead 3b and the second lead 2b are electrically connected in series by the via 6e; and the third lead 3c and the second lead 2c are electrically connected in series by the via 6h.

Figure 9G:
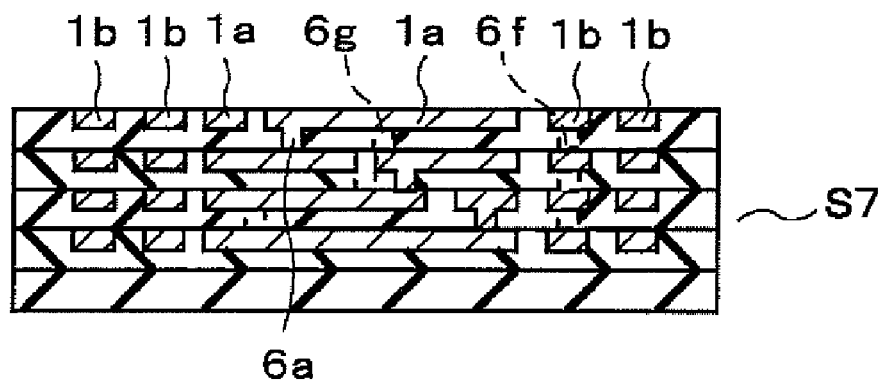

Next, as illustrated in FIG. 9G, similar to the formation method of the second leads 2a, 2b, and 2c and the vias 6b, 6e, and 6h, the vias 6a, 6f, and 6g and the first leads 1a and 1b are formed by a damascene process (step 7). The schematic cross-sectional view illustrated in FIG. 9G is a cross-sectional view along line A-A of FIG. 3A. The second lead 2a and the first lead 1a are electrically connected in series by the via 6a; the second lead 2b and the first lead 1b are electrically connected in series by the via 6f, and the first lead 1b and the second lead 2c are electrically connected in series by the via 6g.

Figure 9H:
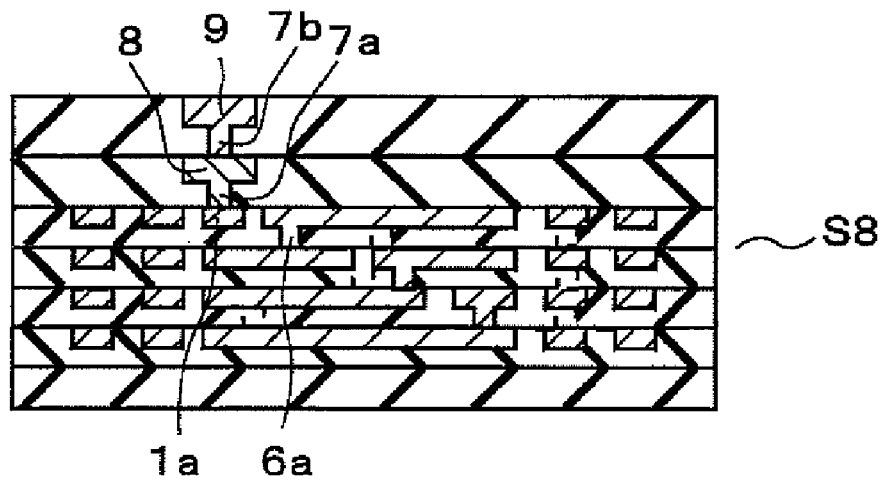

Next, as illustrated in FIG. 9H, the first draw out lead 8 and the via 7a that connects the first draw out lead 8 and the first lead 1a are formed by a damascene process; and similarly, the second draw out lead 9 and the via 7b that connects the second draw out lead 9 and the first draw out lead 8 are formed by a damascene process (step 8).

By the manufacturing method hereinabove, the inductor element according to this exemplary embodiment is obtained. By the inductor element thus obtained, the chip surface area can be reduced; and an increase of unintended parasitic capacitances can be inhibited.

In this exemplary embodiment, a solenoid shaped inductor element having a structure of a total of four layers of leads was described as an example, but is not limited thereto; and the number of layers of leads forming the inductor element may be appropriately determined by the designer of the semiconductor device as long as it does not exceed the number of layers of leads permitted by the design constraints of the semiconductor device. By increasing the number of lead layers forming the inductor element, a solenoid shaped inductor element having a smaller surface area and realizing a large inductance value can be formed.

According to this exemplary embodiment, by forming a solenoid coil shaped inductor element on the semiconductor substrate, the chip surface area can be reduced by increasing the inductance value per unit surface area, and the number of semiconductor devices obtained from a semiconductor substrate can be increased; and therefore, the manufacturing cost of the semiconductor device can be reduced. Further, size reductions of various signal processing devices that are included in the semiconductor device also are possible.

Also, according to this exemplary embodiment, it is possible to reduce the parasitic capacitance of the inductor element; and therefore, the high frequency characteristics of the semiconductor device including the inductor element and active elements can be improved.

Further, according to this exemplary embodiment, the spacing between the inductor element and adjacent elements can be reduced; and from this point as well, the chip surface area can be reduced and the manufacturing cost of the semiconductor device can be reduced.

Figure 10A:
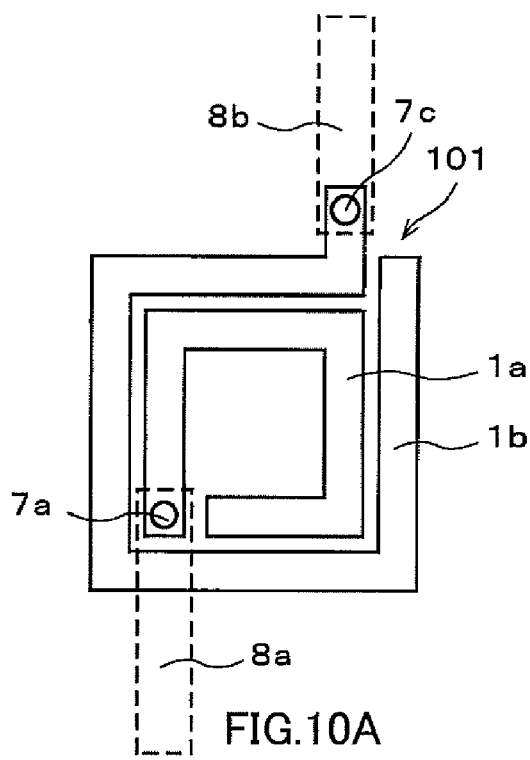
FIG. 10A is a schematic top view illustrating the first lead layer 101 of an inductor element according to a second exemplary embodiment of the present invention.
Figure 10B:
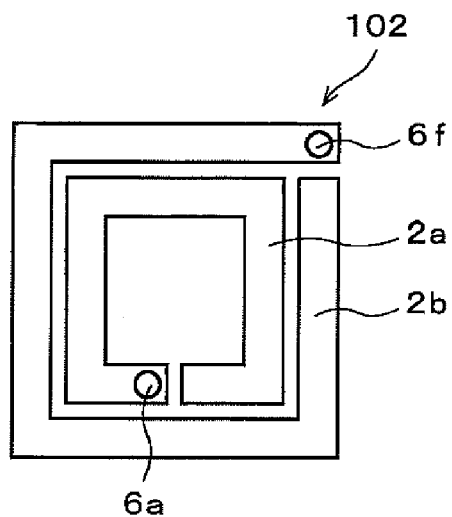
FIG. 10B is a schematic top view illustrating the second lead layer 102 of the same.
Figure 10C:
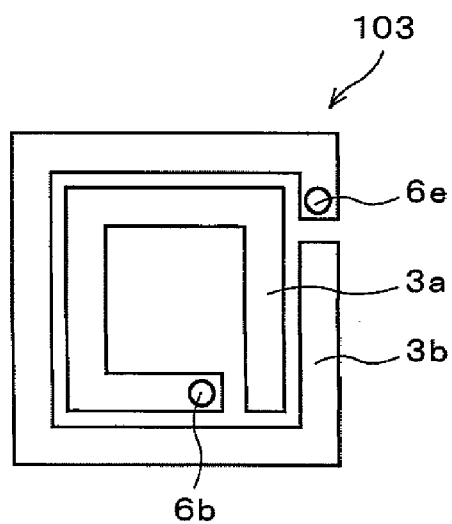
FIG. 10C is a schematic top view illustrating the third lead layer 103 of the same.
Figure 10D:
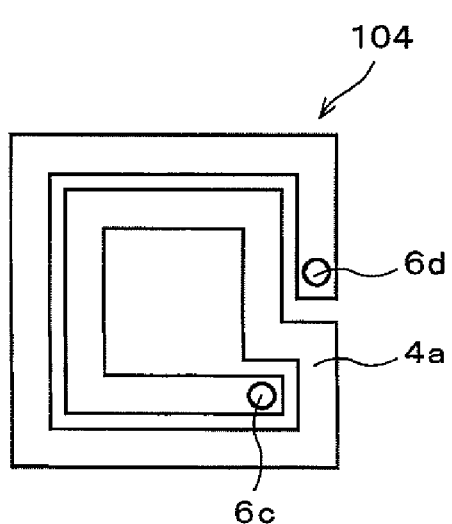
FIG. 10D is a schematic top view illustrating the fourth lead layer 104 of the same.

Next, a second exemplary embodiment of the present invention is described. FIG. 10A is a schematic top view illustrating the first lead layer 101 of an inductor element according to this exemplary embodiment; FIG. 10B is a schematic top view illustrating the second lead layer 102 of the same; FIG. 10C is a schematic top view illustrating the third lead layer 103 of the same; and FIG. 10D is a schematic top view illustrating the fourth lead layer 104 of the same. In FIG. 10, the same reference numerals are given to the same components of FIG. 1 to FIG. 9, and a detailed description thereof is omitted.

In the first exemplary embodiment described above, the inductor element has four lead layers and three winds; one of the draw out leads (the second draw out lead 9) that connects the inductor element and an external element is formed at a position to connect to an uppermost layer lead (the first lead 1a) of the leads of the inductor element; and the other draw out lead is formed by elongating an outermost circumferential lead (the fourth lead 4b) of a lowermost layer lead (the fourth lead) of the leads of the inductor element to an outer side; while in this exemplary embodiment, the inductor element is different in the points that the inductor element has four lead layers and two winds, and the two draw out leads that connect the inductor element to external elements both are formed at positions to connect to the uppermost layer lead of the inductor element; but except for these points, the inductor element has a structure similar to that of the first exemplary embodiment.

As illustrated in FIG. 10D, for the inductor element according to this exemplary embodiment, the fourth lead 4a is wound roughly two winds in a coil shape having a spacing provided such that adjacent portions do not contact in the same plane in an insulative film (not illustrated) on a semiconductor substrate (not illustrated). Then, a via 6c is formed on a longitudinal direction end portion upper face of an inner side of the fourth lead 4a, and a via 6d is formed on a longitudinal direction end portion upper face of an outer side. Thereby, the fourth lead layer 104 is configured.

As illustrated in FIG. 10C, the via 6c is connected to one longitudinal direction end portion lower face of the coil shaped third lead 3a, which is formed in the third lead layer 103 positioned above the fourth lead layer 104 and has a notch in a portion; and the via 6b is formed in the other longitudinal direction end portion upper face of the third lead 3a. Also, the third lead 3b is formed to surround an outer circumference of the third lead 3a in the third lead layer 103; the via 6d is connected to one longitudinal direction end portion lower face of the third lead 3b; and the via 6e is formed on the other longitudinal direction end portion upper face.

As illustrated in FIG. 10B, the via 6b is connected to one longitudinal direction end portion lower face of the coil shaped second lead 2a, which is formed in the second lead layer 102 positioned above the third lead layer 103 and has a notch in a portion; and the via 6a is formed on the other longitudinal direction end portion upper face of the second lead 2a. Also, the second lead 2b is formed to surround an outer circumference of the second lead 2a in the second lead layer 102; the via 6e is connected to one longitudinal direction end portion lower face of the second lead 2b; and the via 6f is formed on the other longitudinal direction end portion upper face.

As illustrated in FIG. 10A, the via 6a is connected to one longitudinal direction end portion lower face of the coil shaped first lead 1a, which is formed in the first lead layer 101 positioned above the second lead layer 102 and has a notch in a portion; and the via 7a is formed on the other longitudinal direction end portion upper face of the first lead 1a. Also, a first lead 1b is formed to surround an outer circumference of the first lead 1a in the first lead layer 101; the via 6f is connected to one longitudinal direction end portion lower face of the first lead 1b; the other longitudinal direction end portion is at a position elongating in an outer side direction of the first lead 1a; and a via 7c is formed on the end portion upper face thereof. Then, the via 7a is connected to a first draw out lead 8a formed in a lead layer positioned above the first lead layer 101; and the via 7c is connected to a second draw out lead 8b formed in the same lead layer as the first draw out lead 8a. Thereby, the inductor element according to this exemplary embodiment is configured. In other words, the inductor element according to this exemplary embodiment has a lead structure in which a parasitic capacitance between vertically adjacent leads described in the first exemplary embodiment described above is larger than the parasitic capacitance between mutually adjacent leads in the same lead layer, wherein a solenoid shaped inductor element having a configuration similar to the first exemplary embodiment has an even number (two) of winds, and draw out leads (the first draw out lead 8a and the second draw out lead 8b) that connect the solenoid shaped inductor element to an external element are formed at positions to connect to the first leads 1a and 1b positioned in the uppermost layer of the solenoid shaped inductor element.

The configuration, operations, and effects of this exemplary embodiment except those recited above are similar to that of the first exemplary embodiment described above.

Next, a third exemplary embodiment of the present invention is described. The inductor element according to this exemplary embodiment has a structure in which the structure of the inductor element according to the second exemplary embodiment described above is vertically inverted. In other words, the first lead layer 101 illustrated in FIG. 10A is formed in the lowermost layer of the leads of the inductor element in a vertically inverted state; sequentially thereupon, the second lead layer 102 illustrated in FIG. 10B, the third lead layer 103 illustrated in FIG. 10C, and the fourth lead layer 104 illustrated in FIG. 10D are laminated in a vertically inverted state; and thereby, two draw out leads (the first draw out lead 8a and the second draw out lead 8b) that connect the solenoid shaped inductor element and external elements are formed at positions to connect to the first leads 1a and 1b positioned in the lowermost layer of the solenoid shaped inductor element. Thereby, the inductor element according to this exemplary embodiment is configured.

The configuration, operations, and effects of this exemplary embodiment except those recited above are similar to those of the first exemplary embodiment described above.

Next, a fourth exemplary embodiment of the present invention is described. FIG. 11A is a schematic top view illustrating first leads formed in the first lead layer 101 of the inductor element according to this exemplary embodiment; FIG. 11B is a schematic top view illustrating second leads formed in the second lead layer 102 of the same; FIG. 11C is a schematic top view illustrating third leads formed in the third lead layer 103 of the same; and FIG. 11D is a schematic top view illustrating fourth leads formed in the fourth lead layer 104 of the same. In FIG. 11, the same reference numerals are given to the same components of FIG. 1 to FIG. 10, and a detailed description thereof is omitted.

As illustrated in FIG. 11D, in the inductor element according to this exemplary embodiment, the fourth lead 4a is wound roughly two winds in a coil shape having a spacing provided such that adjacent portions do not contact in the same plane in an insulative film (not illustrated) on a semiconductor substrate (not illustrated). Then, a via 6c is formed on a longitudinal direction end portion upper face of an inner side of the fourth lead 4a, and a via 6d is formed on a longitudinal direction end portion upper face of an outer side. Also, the fourth lead 4b is formed to wind roughly two winds in a coil shape having a spacing provided such that adjacent portions do not contact to surround an outer circumference of the fourth lead 4a in the fourth lead layer 104; the via 6i is formed on a longitudinal direction end portion upper face of an inner side of the fourth lead 4b; and a via 6j is formed on a longitudinal direction end portion upper face of an outer side. Thereby, the fourth lead layer 104 is configured.

As illustrated in FIG. 11C, the via 6c is connected to one longitudinal direction end portion lower face of the coil shaped third lead 3a, which is formed in the third lead layer 103 positioned above the fourth lead layer 104 and has a notch in a portion; and the via 6b is formed on the other longitudinal direction end portion upper face of the third lead 3a. Also, the third lead 3b is formed to surround an outer circumference of the third lead 3a in the third lead layer 103; the via 6d is connected to one longitudinal direction end portion lower face of the third lead 3b; and the via 6e is formed on the other longitudinal direction end portion upper face. Additionally, the third lead 3c is formed to surround an outer circumference of the third lead 3b in the third lead layer 103; the via 6i is connected to one longitudinal direction end portion lower face of the third lead 3c; and the via 6h is formed on the other longitudinal direction end portion upper face. Further, a third lead 3d is formed to surround an outer circumference of the third lead 3c in the third lead layer 103; the via 6j is connected to one longitudinal direction end portion lower face of the third lead 3d; and a via 6k is formed on the other longitudinal direction end portion upper face.

As illustrated in FIG. 11B, the via 6b is connected to one longitudinal direction end portion lower face of the coil shaped second lead 2a, which is formed in the second lead layer 102 positioned above the third lead layer 103 and has a notch in a portion; and the via 6a is formed on the other longitudinal direction end portion upper face of the second lead 2a. Also, the second lead 2b is formed to surround an outer circumference of the second lead 2a in the second lead layer 102; the via 6e is connected to one longitudinal direction end portion lower face of the second lead 2b; and the via 6f is formed on the other longitudinal direction end portion upper face. Additionally, the second lead 2c is formed to surround an outer circumference of the second lead 2b in the second lead layer 102; the via 6h is connected to one longitudinal direction end portion lower face of the second lead 2c; and the via 6g is formed on the other longitudinal direction end portion upper face. Further, a second lead 2d is formed to surround an outer circumference of the second lead 2c in the second lead layer 102; the via 6k is connected to one longitudinal direction end portion lower face of the second lead 2d; and a via 6m is formed on the other longitudinal direction end portion upper face.

As illustrated in FIG. 11A, the via 6a is connected to one longitudinal direction end portion lower face of the coil shaped first lead 1a, which is formed in the first lead layer 101 positioned above the second lead layer 102 and has a notch in a portion; and the via 7a is formed on the other longitudinal direction end portion upper face of the first lead 1a. Also, the first lead 1b is formed to wind roughly two winds in a coil shape having a spacing provided such that adjacent portions do not contact to surround an outer circumference of a first lead 1a in the first lead layer 101; the via 6f is connected to a longitudinal direction end portion lower face of an inner side of the first lead 1b; and the via 6g is connected to a longitudinal direction end portion lower face of an outer side. Further, a first lead 1c is formed to surround an outer circumference of the first lead 1b in the first lead layer 101; the via 6m is connected to one longitudinal direction end portion lower face of the first lead 1c; and the via 7c is formed on the other longitudinal direction end portion upper face.

The via 7a is connected to the first draw out lead 8a formed in a lead layer positioned above the first lead layer 101; and the via 7c is connected to the second draw out lead 8b formed on the same lead layer as the first draw out lead 8a. Thereby, the inductor element according to this exemplary embodiment is configured. In other words, the inductor element according to this exemplary embodiment has a lead structure in which a parasitic capacitance between vertically adjacent leads described in the first exemplary embodiment described above is larger than the parasitic capacitance between mutually adjacent leads in the same lead layer, wherein the solenoid shaped inductor element having a configuration similar to that of the first exemplary embodiment has an even number (four) of winds; and draw out leads (the first draw out lead 8a and the second draw out lead 8b) that connect the solenoid shaped inductor element to external elements are formed at positions to connect to the first leads 1a and 1b positioned in the uppermost layer of the solenoid shaped inductor element.

The inductor element according to this exemplary embodiment has two leads (the fourth leads 4a and 4b) that form roughly two winds in the lowermost layer (the fourth lead layer 104) of the leads of the inductor element. Thereby, the inductor element according to this exemplary embodiment has more winds than the winds of the inductor element according to the first to third exemplary embodiments described above; and therefore, the inductance value can be improved.

Moreover, it is possible to further improve the inductance value of the inductor element according to this exemplary embodiment by a configuration in which the first lead 1c illustrated in FIG. 11A forms roughly two winds; and thereinafter, similar to the other exemplary embodiments of the present invention described above, leads forming roughly one wind are provided also in each lead layer positioned in the lower layers of the first lead 1c, wherein each are connected in series.

In the case where the inductor element according to the present invention is formed as described in this exemplary embodiment, it is possible to easily increase the inductance value further by providing further multiple leads that form roughly two winds.

Figure 12A:
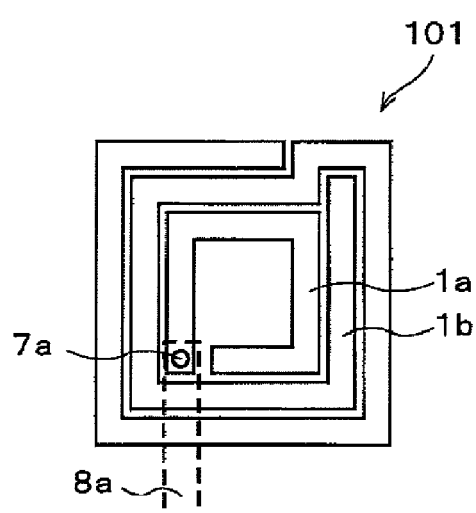
FIG. 12A is a schematic top view illustrating first leads formed in the first lead layer 101 of an inductor element according to a fifth exemplary embodiment of the present invention.
Figure 12B:
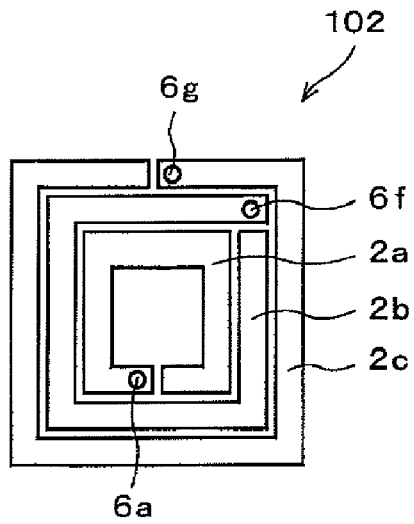
FIG. 12B is a schematic top view illustrating second leads formed in the second lead layer 102 of the same.
Figure 12C:
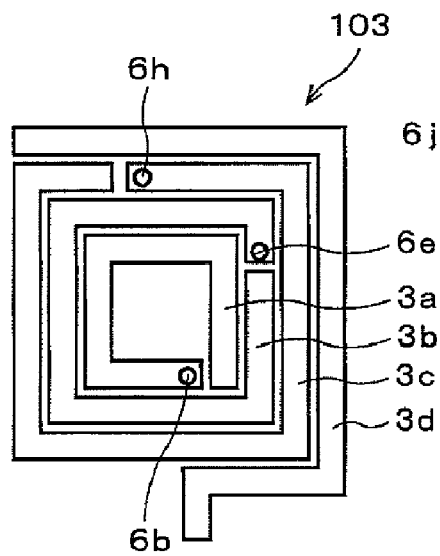
FIG. 12C is a schematic top view illustrating third leads formed in the third lead layer 103 of the same.
Figure 12D:
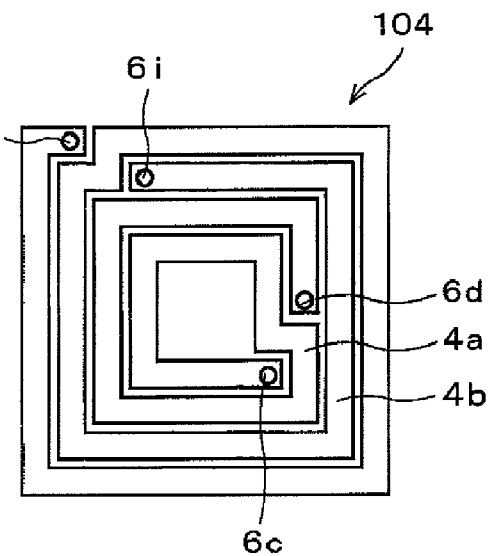
FIG. 12D is a schematic top view illustrating fourth leads formed in the fourth lead layer 104 of the same.

Next, a fifth exemplary embodiment of the present invention is described. FIG. 12A is schematic top view illustrating first leads formed in the first lead layer 101 of the inductor element according to this exemplary embodiment; FIG. 12B is a schematic top view illustrating second leads formed in the second lead layer 102 of the same; FIG. 12C is a schematic top view illustrating third leads formed in the third lead layer 103 of the same; and FIG. 12D is a schematic top view illustrating fourth leads formed in the fourth lead layer 104 of the same. In FIG. 12, the same reference numerals are given to the same components of FIG. 1 to FIG. 11, and a detailed description thereof is omitted.

In the inductor element according to this exemplary embodiment, at least one of the draw out leads of the draw out leads that connect the inductor element to external elements is formed by elongating a lead positioned at the outermost circumference of any lead layer of the leads of the inductor element. This lead can be selected by the circuit designer. In this exemplary embodiment, an example is described in which a lead positioned on the outermost circumference of the third lead layer 103 is selected.

As illustrated in FIG. 12D, in the inductor element according to this exemplary embodiment, the fourth lead 4a is wound roughly two winds in a coil shape having a spacing provided such that adjacent portions do not contact in the same plane in an insulative film (not illustrated) on a semiconductor substrate (not illustrated). Then, a via 6c is formed on a longitudinal direction end portion upper face of an inner side of the fourth lead 4a; and a via 6d is formed on a longitudinal direction end portion upper face of an outer side. Also, the fourth lead 4b is formed to wind roughly two winds in a coil shape having a spacing provided such that adjacent portions do not contact to surround an outer circumference of the fourth lead 4a in the fourth lead layer 104; the via 6i is formed on a longitudinal direction end portion upper face of the inner side of the fourth lead 4b; and the via 6j is formed on a longitudinal direction end portion upper face of the outer side. Thereby, the fourth lead layer 104 is configured.

As illustrated in FIG. 12C, the via 6c is connected to one longitudinal direction end portion lower face of the coil shaped third lead 3a, which is formed in the third lead layer 103 positioned above the fourth lead layer 104 and has a notch at a portion; and the via 6b is formed on the other longitudinal direction end portion upper face of the third lead 3a. Also, the third lead 3b is formed to surround an outer circumference of the third lead 3a in the third lead layer 103; the via 6d is connected to one longitudinal direction end portion lower face of the third lead 3b; and the via 6e is formed on the other longitudinal direction end portion upper face. Additionally, the third lead 3c is formed to surround an outer circumference of the third lead 3b in the third lead layer 103; the via 6i is connected to one longitudinal direction end portion lower face of the third lead 3c; and the via 6h is formed on the other longitudinal direction end portion upper face. Further, the bent third lead 3d is formed having a bent portion provided at any intermediate portion of an outer circumference of the third lead 3c in the third lead layer 103; the via 6j is connected to one longitudinal direction end portion lower face of the third lead 3d; and the other longitudinal direction end portion is positioned elongating in an outer side direction from the bent portion as a draw out lead that connects the inductor element to an external element.

As illustrated in FIG. 12B, the via 6b is connected to one longitudinal direction end portion lower face of the coil shaped second lead 2a, which is formed in the second lead layer 102 positioned above the third lead layer 103 and has a notch at a portion; and the via 6a is formed on the other longitudinal direction end portion upper face of the second lead 2a. Also, the second lead 2b is formed to surround an outer circumference of the second lead 2a in the second lead layer 102; the via 6e is connected to one longitudinal direction end portion lower face of the second lead 2b; and the via 6f is formed on the other longitudinal direction end portion upper face. Further, the second lead 2c is formed to surround an outer circumference of the second lead 2b in the second lead layer 102; the via 6h is connected to one longitudinal direction end portion lower face of the second lead 2c; and the via 6g is formed on the other longitudinal direction end portion upper face.

As illustrated in FIG. 12A, the via 6a is connected to one longitudinal direction end portion lower face of the coil shaped first lead 1a, which is formed in the first lead layer 101 positioned above the second lead layer 102 and has a notch on a portion; and the via 7a is formed on the other longitudinal direction end portion upper face of the first lead 1a. Also, the first lead 1b is formed to wind roughly two winds in a coil shape having a spacing provided such that adjacent portions do not contact to surround an outer circumference of the first lead 1a in the first lead layer 101; the via 6f is connected to a longitudinal direction end portion lower face of an inner side of the first lead 1b; and the via 6g is connected to a longitudinal direction end portion lower face of the outer side. Further, the via 7a is connected to the first draw out lead 8a formed in a lead layer positioned above the first lead layer 101. Thereby, the inductor element according to this exemplary embodiment is configured.

According to this exemplary embodiment, in addition to the effects obtained by the first to fourth exemplary embodiments described above, the degrees of freedom of the design improve.

Also, as illustrated in FIG. 12C, the third lead 3d, which is the outermost circumferential lead, is bent at a bent portion provided at any intermediate portion of the outer circumference of the third lead 3c; and therefore, in comparison to, for example, the inductor element according to the second exemplary embodiment of the present invention, the total length of the leads of the inductor element is short. Accordingly, the inductance value declines; and in other words, in the case where the inductance value of the inductor element according to the second exemplary embodiment of the present invention is a standard value, it can be said that the inductance value of the inductor element according to this exemplary embodiment has an inductance value that is finely adjusted from the standard value. Accordingly, it is possible to finely adjust the inductance value of the inductor element according to this exemplary embodiment by the number of layers in which the outermost circumferential lead is used without modifying the design parameters of the inductor element such as the inner diameter, lead width, lead spacing, and the like.

Therefore, according to this exemplary embodiment, the circuit designer can freely select lead layers forming the draw out leads; and therefore, the degrees of freedom of design of the semiconductor device improve; and further, it is possible to finely adjust the inductance value.

Figure 13:
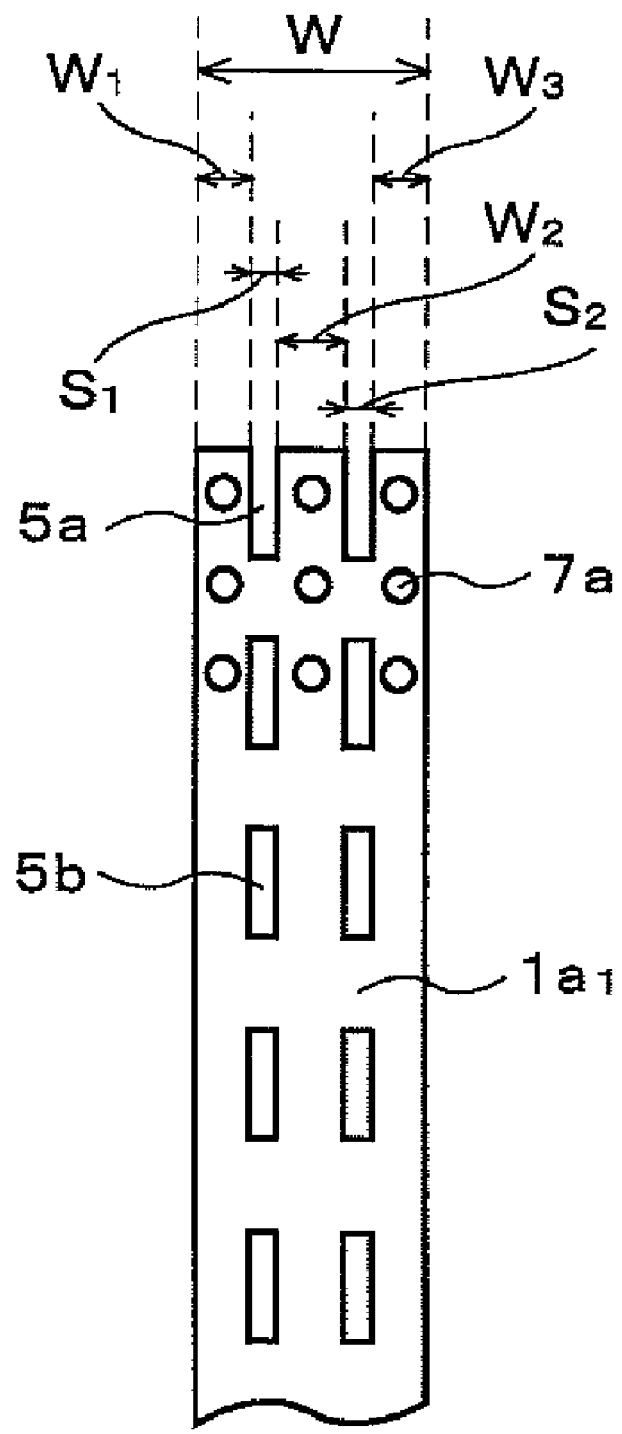
FIG. 13 is a schematic plan view of an extracted portion of a lead of an inductor element according to a sixth exemplary embodiment of the present invention.
Figure 14A:
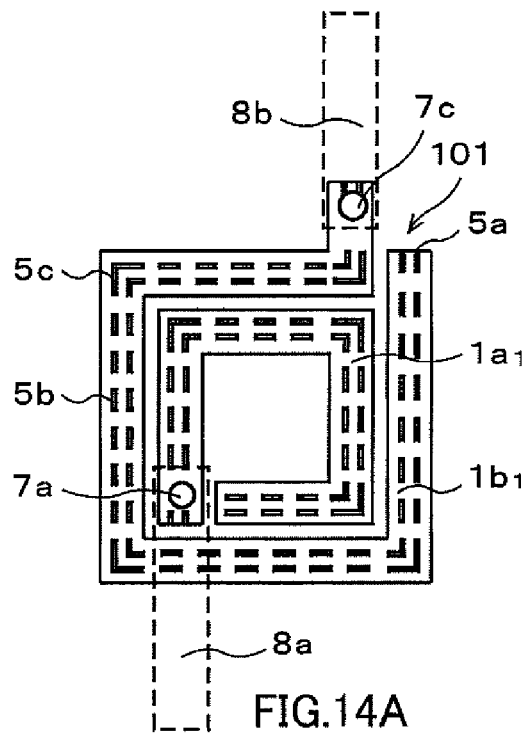
FIG. 14A is a schematic top view illustrating first leads formed in the first lead layer 101 of the inductor element according to the sixth exemplary embodiment of the present invention.
Figure 14B:
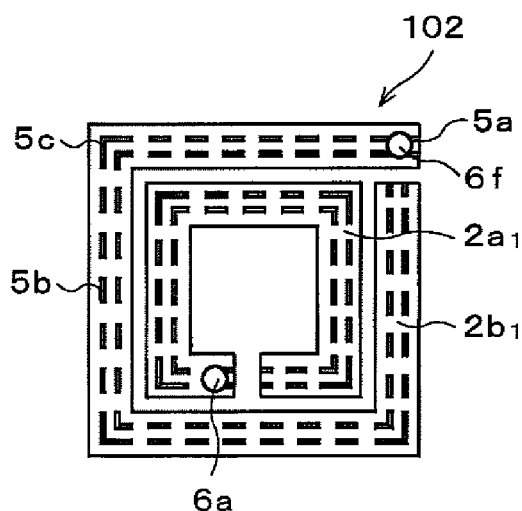
FIG. 14B is a schematic top view illustrating second leads formed in the second lead layer 102 of the same.
Figure 14C:
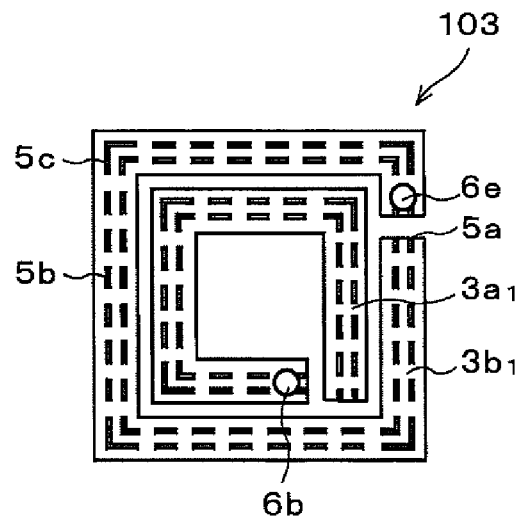
FIG. 14C is a schematic top view illustrating third leads formed in the third lead layer 103 of the same.
Figure 14D:
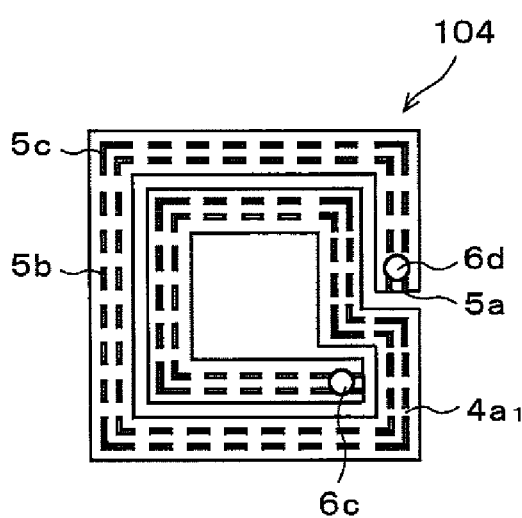
FIG. 14D is a schematic top view illustrating a fourth lead formed in the fourth lead layer 104 of the same.

Next, a sixth exemplary embodiment of the present invention is described. FIG. 13 is a schematic plan view of an extracted portion of a lead of the inductor element according to this exemplary embodiment; FIG. 14A is a schematic top view illustrating first leads formed in the first lead layer 101 of the inductor element according to this exemplary embodiment; FIG. 14B is a schematic top view illustrating second leads formed in the second lead layer 102 of the same; FIG. 14C is a schematic top view illustrating third leads formed in the third lead layer 103 of the same; and FIG. 14D is a schematic top view illustrating a fourth lead formed in the fourth lead layer 104 of the same. In FIG. 13 and FIG. 14, the same reference numerals are given to the same components of FIG. 1 to FIG. 12, and a detailed description thereof is omitted.

The inductor element according to this exemplary embodiment adapts the inductor element of the present invention to constraints of the manufacturing process of lead structures of recent miniaturized semiconductor devices. In other words, in a recent miniaturized semiconductor device, from constraints of the manufacturing process, the minimum lead width and the maximum lead width of the leads of the semiconductor device are often prescribed. However, the inductor element may need a lead width larger than the maximum lead width prescribed by constraints of the process due to the size of the current flowing in the inductor element. In this case, the inductor element according to the present invention can include a lead having a slit. The present invention is devised to reduce the parasitic capacitance of the lead of the inductor element; and even in the case where the lead of the inductor element is a lead having a slit, the effects thereof can be obtained sufficiently.

In the inductor element according to this exemplary embodiment, at least one of the leads of the inductor element and the draw out leads connecting the inductor element to external elements has a slit. In the inductor element according to this exemplary embodiment, as illustrated in FIG. 13, slits 5a in two rows in a lead width direction are made in a longitudinal direction end portion of a first lead $1a_1$; also, slits 5b in two rows in the lead width direction are made in an interior of the first lead $1a_1$. The slits 5a have a C-shape that is open at the longitudinal direction end of the first lead $1a_1$; the slits 5b have a rectangular shaped aperture in a straight line portion of the first lead $1a_1$; and slits 5c (not illustrated) have a bent rectangular shaped aperture at a bent portion of the first lead $1a_1$.

As illustrated in FIG. 13, the circuit designer can determine a lead width w of the first lead $1a_1$ such that the total of each of the lead widths $w_1$, $w_2$, and $w_3$ separated by the slits is larger than the lead width necessary for realizing the desired electromigration resistance of the inductor element or series resistance, where w is the lead width of the first lead $1a_1$; $w_1$ is the width of the lead from one edge in the lead width direction to one of the two rows of slits proximal to the edge; $s_1$ is the width of the slit; $w_2$ is the width of the lead from the slit to another slit; $s_2$ is the width of the other slit; and $w_3$ is the width of the lead from the other slit to another end in the lead width direction of the first lead $1a_1$. Then, the inductor element is formed by the first lead $1a_1$. Here, it is favorable that the sizes of the slit widths $s_1$ and $s_2$ are the minimum lead spacing prescribed by the constraints of the process. Further, as illustrated in FIG. 13, the via 7a, which connects the first lead $1a_1$ having slits to a lead layer (not illustrated) positioned above the first lead layer 101, is a multi-via illustrated in FIG. 5, and is formed to avoid the slits; but in this exemplary embodiment, hereinafter, to simplify notation, multiple vias are notated as single vias.

In the inductor element according to this exemplary embodiment, at least one of the leads of the inductor element and the draw out leads connecting the inductor element to external elements has a slit, and can be implemented in any of the inductor elements according to the first exemplary embodiment to the fifth exemplary embodiment of the present invention described above. Hereinbelow, as an example, slits made in each lead of the inductor element according to the second exemplary embodiment of the present invention are described as this exemplary embodiment.

As illustrated in FIG. 14D, in the inductor element according to this exemplary embodiment, a fourth lead $4a_1$, in which slits 5a, 5b, and 5c are made similarly to those of the first lead $1a_1$ described above, is wound roughly two winds in a coil shape having a spacing provided such that adjacent portions do not contact in the same plane in an insulative film (not illustrated) on a semiconductor substrate (not illustrated). Then, the via 6c is formed on a longitudinal direction end portion upper face of an inner side of a fourth lead $4a_1$; and the via 6*d* is formed on a longitudinal direction end portion upper face of an outer side. Thereby, the fourth lead layer 104 is configured.

As illustrated in FIG. 14C, the via 6*c* is connected to one longitudinal direction end portion lower face of a coil shaped third lead 3*a*$_1$, which is formed in the third lead layer 103 positioned above the fourth lead layer 104 and has the slits 5*a*, 5*b*, and 5*c* and a notch in a portion; and the via 6*b* is formed on the other longitudinal direction end portion upper face of the third lead 3*a*$_1$. Also, a third lead 3*b*$_1$ is formed to surround an outer circumference of the third lead 3*a*$_1$ in the third lead layer 103; the via 6*d* is connected to one longitudinal direction end portion lower face of the third lead 3*b*$_1$; and the via 6*e* is formed on the other longitudinal direction end portion upper face.

As illustrated in FIG. 14B, the via 6*b* is connected to one longitudinal direction end portion lower face of a coil shaped second lead 2*a*$_1$, which is formed in the second lead layer 102 positioned above the third lead layer 103 and has the slits 5*a*, 5*b*, and 5*c* and a notch in a portion; and the via 6*a* is formed on the other longitudinal direction end portion upper face of the second lead 2*a*$_1$. Additionally, a second lead 2*b*$_1$ is formed to surround an outer circumference of the second lead 2*a*$_1$ in the second lead layer 102; the via 6*e* is connected to one longitudinal direction end portion lower face of the second lead 2*b*$_1$; and the via 6*f* is formed on the other longitudinal direction end portion upper face.

As illustrated in FIG. 14A, the via 6*a* is connected to one longitudinal direction end portion lower face of a coil shaped first lead 1*a*$_1$, which is formed in the first lead layer 101 positioned above the second lead layer 102 and has the slits 5*a*, 5*b*, and 5*c* and a notch in a portion; and the via 7*a* is formed on the other longitudinal direction end portion upper face of the first lead 1*a*$_1$. Also, the first lead 1*b*$_1$ is formed to surround an outer circumference of the first lead 1*a*$_1$ in the first lead layer 101; the via 6*f* is connected to one longitudinal direction end portion lower face of a first lead 1*b*$_1$; and the other longitudinal direction end portion is positioned elongating in an outer side direction of the first lead 1*a*$_1$, and the via 7*c* is formed on an end portion upper face thereof. Then, the via 7*a* is connected to the first draw out lead 8*a* formed in a lead layer positioned above the first lead layer 101; and the via 7*c* is connected to the second draw out lead 8*b* formed in the same lead layer as the first draw out lead 8*a*. Thereby, the inductor element according to this exemplary embodiment is configured.

In this exemplary embodiment, the case where all of the leads of the inductor element have slits is described; but the embodiment is not limited thereto, and may be implemented in the case where it is difficult to realize the desired lead width of the circuit designer due to constraints of the manufacturing process of the semiconductor device; and the circuit designer can determine whether to form or not to form slits in any of the leads or draw out leads of the inductor element.

In the inductor element according to this exemplary embodiment, at least one of the leads of the inductor element and the draw out leads connecting the inductor element to external elements has a slit; and therefore, the practically effective series resistance of the inductor element can be reduced; and the electromigration resistance of the inductor element can be improved. In other words, in the case where the circuit designer cannot realize the desired lead width by a single lead due to the constraints of the manufacturing process for the inductor element according to this exemplary embodiment, implementation is possible by a lead having a slit to imitate a lead having a large lead width.

According to this exemplary embodiment, even in the case where the lead of the inductor element has a slit due to constraints of the manufacturing process of recent miniaturized semiconductor devices, the effects of the present invention can be obtained.

Next, a seventh exemplary embodiment of the present invention is described. The inductor element according to this exemplary embodiment has a structure in which the structure of the inductor element according to the sixth exemplary embodiment described above is vertically inverted. In other words, the lowermost layer of the leads of the inductor element is formed in a state in which the first lead layer 101 illustrated in FIG. 14A is vertically inverted; and sequentially thereupon, the second lead layer 102 illustrated in FIG. 14B, the third lead layer 103 illustrated in FIG. 14C, and the fourth lead layer 104 illustrated in FIG. 14D are laminated in a vertically inverted state; and thereby, two draw out leads (the first draw out lead 8*a* and the second draw out lead 8*b*) connecting the solenoid shaped inductor element to external elements are formed at positions to connect to the first leads 1*a* and 1*b* positioned in the lowermost layer of the solenoid shaped inductor element. Thereby, the inductor element according to this exemplary embodiment is configured.

In this exemplary embodiment, the draw out leads 8*a* and 8*b* connecting the inductor element to external elements are formed using lower layer lead layers; but in the lead structure of miniaturized semiconductor devices that are currently widely used, it is general that the lead widths permitted by the manufacturing process become finer as leads are formed in lower layers. Accordingly, in the inductor element according to this exemplary embodiment, the leads of the inductor element may have no slits, and only draw out leads positioned in a lower layer may have a slit.

The configuration, operations, and effects of this exemplary embodiment except those recited above are similar to those of the sixth exemplary embodiment described above.

Figure 15:
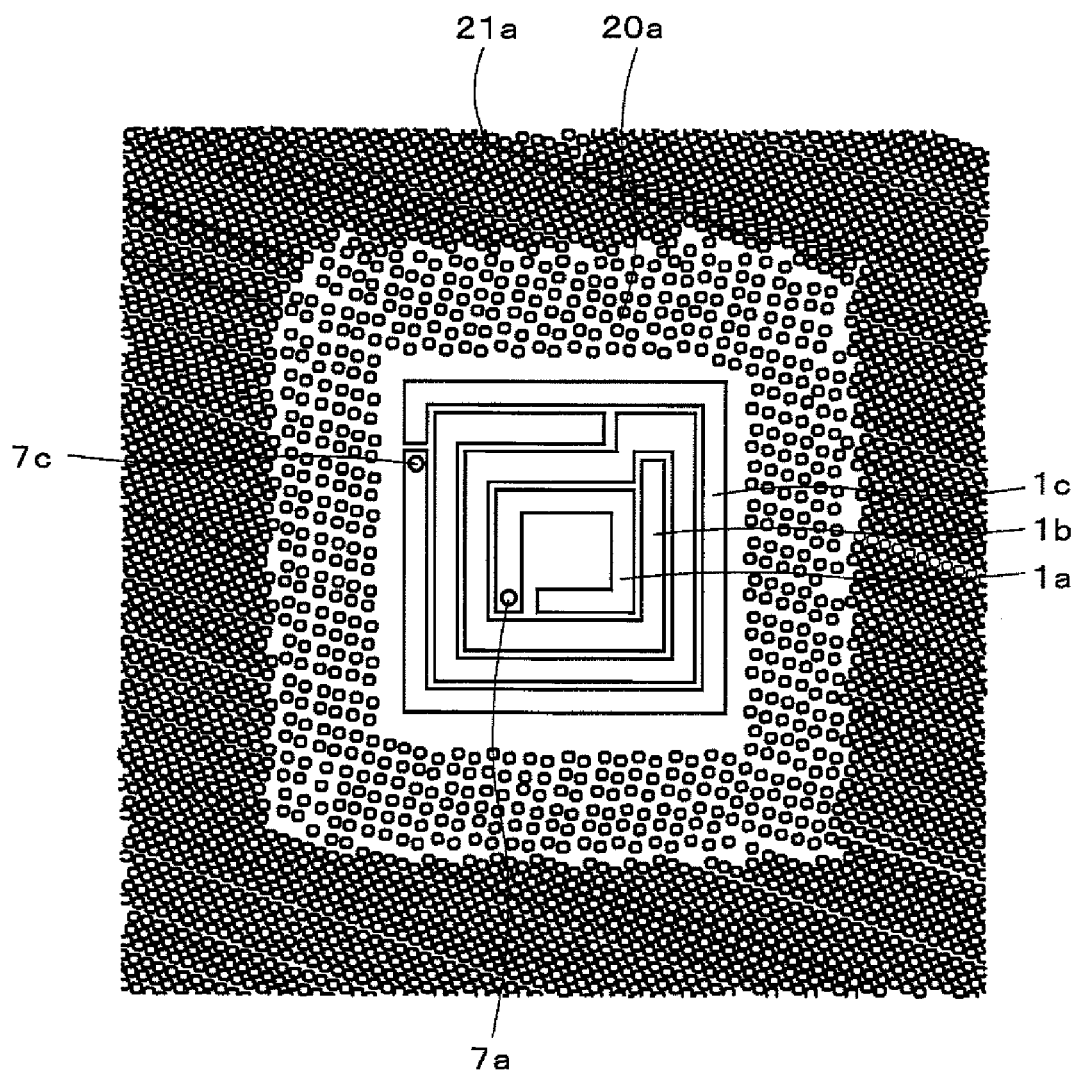
FIG. 15 is a schematic top view illustrating the first lead layer 101 of an inductor element according to an eighth exemplary embodiment of the present invention.
Figure 16:
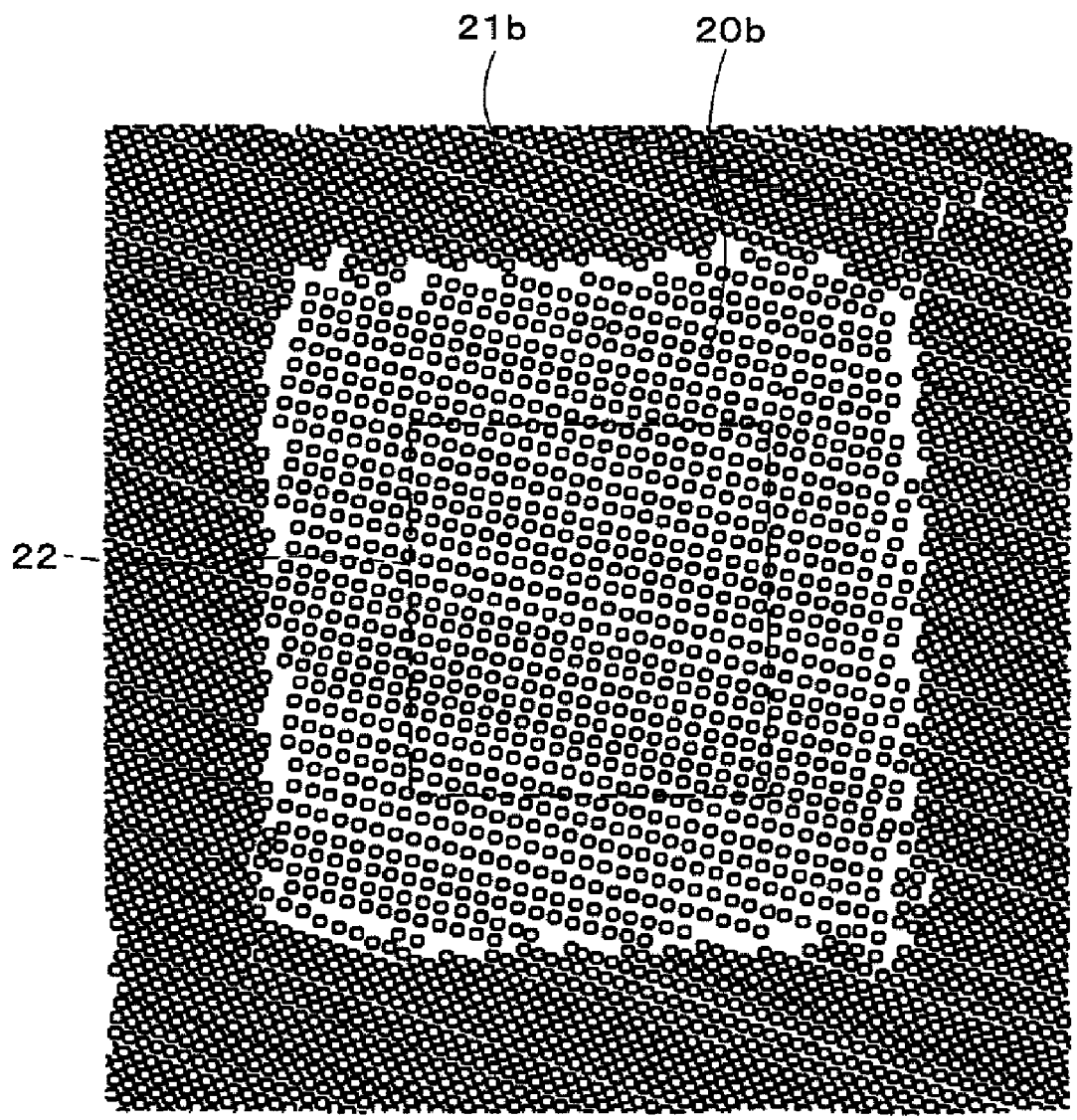
FIG. 16 is a schematic cross-sectional view illustrating a dummy metal disposition of a lead layer positioned on a layer below the first lead layer 101.

Next, an eighth exemplary embodiment of the present invention is described. FIG. 15 is a schematic top view illustrating the first lead layer 101 of the inductor element according to this exemplary embodiment; and FIG. 16 is a schematic cross-sectional view illustrating a dummy metal disposition of a lead layer positioned in a layer below the first lead layer 101. In FIG. 15 and FIG. 16, the same reference numerals are given to the same components of FIG. 1 to FIG. 14, and a detailed description thereof is omitted.

This exemplary embodiment controls the density of dummy metal formed around the inductor element according to the present invention and thereby prevents the performance deterioration of the inductor element brought about by the dummy metal, and can be implemented also to the inductor elements of any of the first to seventh exemplary embodiments of the present invention described above. Hereinbelow, an example of the control of the density of the dummy metal formed around the inductor element according to the third exemplary embodiment of the present invention is described as this exemplary embodiment.

The inductor element according to this exemplary embodiment adapts the present invention to the constraints of the manufacturing process of a lead structure of a recent miniaturized semiconductor device. In recent miniaturized semiconductor devices, leads are often formed by a lead manufacturing method referred to as the damascene process described in the manufacturing method of the first exemplary embodiment of the present invention. In this manufacturing method, as illustrated in the manufacturing method of the first exemplary embodiment of the present invention, metal leads are formed by making lead shaped grooves (lead groove pattern)

in the insulative film; depositing a metal film in the lead groove pattern and then removing the excess metal film by a flattening method such as, for example, chemical mechanical polishing (CMP) and the like. When flattening the metal film by the flattening process, polishing rates of the metal film and the insulative film are different; and therefore, the film thickness of the film between the lead layers becomes nonuniform. To solve this problem, in a recent lead formation step, planarity is improved by forming dummy leads in a region other than the leads used in the circuit of the semiconductor device. Such dummy leads generally are referred to as dummy metal.

The dummy metal is connected neither to the circuit of the semiconductor device, nor notably, to the inductor element; but the dummy metal exists around the inductor element; and thereby, unfortunately, the capacitance between the leads of the inductor element and the semiconductor substrate, the capacitance between a signal lead or a grounding lead existing in the leads of the inductor element and surrounding the inductor element, or the like practically and effectively become large. Further, a magnetic field is created by the inductor element, and thereby, the loss of the inductor element unfortunately is large due to an eddy current excited in the dummy metal.

This exemplary embodiment controls the density of the dummy metal formed around the inductor element according to the present invention and thereby prevents the performance deterioration of the inductor element brought about by the dummy metal.

In the inductor element according to this exemplary embodiment, as illustrated in FIG. 15, dummy metal groups 20a and 21a having mutually different densities around the leads of the inductor element in the first lead layer 101 of the inductor element according to the third exemplary embodiment of the present invention are formed. A dummy metal group 20a formed in a proximity of the leads of the inductor element has a low density; and a dummy metal group 21a formed outside of the proximity of the leads of the inductor element has a high density. Similarly, the dummy metal groups 20a and 21a are formed around the leads of the inductor element also in the second lead layer 102, the third lead layer 103, and the fourth lead layer 104.

Also, as illustrated in FIG. 16, a dummy metal group 20b is formed in a lead layer directly below that in which the inductor element is formed, and has a low density in a region 22 for which the inductor element is formed directly above and the proximity thereof, and a dummy metal group 21b is formed having a high density outside of the region 22 in which the inductor element is formed and the proximity thereof. Similarly, in a lead layer directly above the inductor element, the dummy metal group 20b is formed having a low density in the region 22 for which the inductor element is formed directly below and the proximity thereof, and the dummy metal group 21b is formed having a high density outside of the region 22 in which the inductor element is formed and the proximity thereof.

As a design constraint of a recent semiconductor device in which a lead manufacturing method by a damascene process is used, the minimum density of a metal existing in a fixed region often is decided. In this exemplary embodiment, the dummy metal groups 20a and 20b are formed having lowered densities only after satisfying the minimum density reference of the metal. In other words, according to this exemplary embodiment, by lowering the density of the dummy metal, which is a factor in the performance deterioration of the inductor element, in the proximity of each lead of the inductor element, the performance deterioration can be inhibited. Here, it is favorable that the regions of the dummy metal groups 20a and 20b having low densities are formed as wide as possible, but are suppressed to about that which is permitted by the design rules prescribed by the manufacturing process.

Also, for the dummy metal groups 20a and 20b having low densities, a lowering of the density may be performed by making the size of each of the dummy metal belonging thereto smaller than those of each dummy metal formed in the dummy metal groups 21a and 21b having high densities; further, this lowering of the density may be performed by making the spacing between each dummy metal belonging to the dummy metal groups 20a and 20b having low densities larger than the spacing between each dummy metal of the dummy metal groups 21a and 21b having high densities. Additionally, by making the size of each dummy metal smaller and making the spacing larger between each dummy metal, the dummy metal groups 20a and 20b having low densities may be formed.

In the illustrated example of FIG. 15 and FIG. 16, an example is illustrated in which the density of the dummy metal is changed in two stages of the low density dummy metal groups 20a and 20b and the high density dummy metal groups 21a and 21b; but the dummy metal is not limited thereto; and three or more dummy metal groups having mutually different densities may be formed. In other words, the stages of which the density is changed may be three or more stages; and further, the density change of the dummy metal may be continuous, and may be formed by a structure in which the dummy metal density increases gradually as the distance from the inductor element increases.

Also, in this exemplary embodiment, in the proximity of the inductor element, a description of a surrounding region in a horizontal direction of each metal lead of the inductor element is recited; but the inductor element according to the present invention has a three dimensional widening; and therefore, the definition of the proximity of the inductor element includes the regions of the upper portion and the lower portion of the inductor element.

According to this exemplary embodiment, effects of the dummy metal on the inductor element can be alleviated; and the performance deterioration of the inductor element brought about by the dummy metal used in the manufacturing process of the lead structure of a recent miniaturized semiconductor device can be inhibited.

Figure 17A:
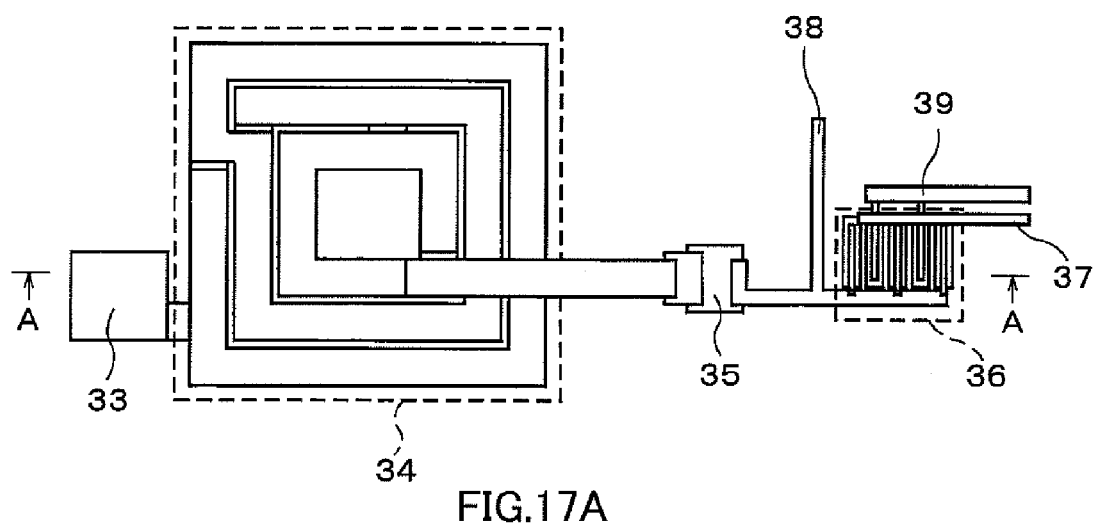
FIG. 17A is a schematic top view of a semiconductor device according to a ninth exemplary embodiment of the present invention.
Figure 17B:
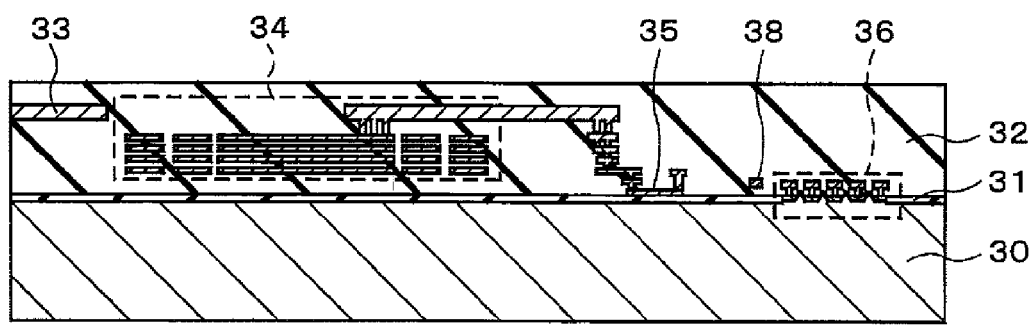
FIG. 17B is a cross-sectional view along line A-A of FIG. 17A.

Next, a ninth exemplary embodiment of the present invention is described. FIG. 17A is a schematic top view of a semiconductor device according to this exemplary embodiment; FIG. 17B is a cross-sectional view along line A-A of FIG. 17A; and FIG. 18 is a circuit diagram of the semiconductor device according to this exemplary embodiment. In FIG. 17 and FIG. 18, the same reference numerals are given to the same components of FIG. 1 to FIG. 16, and a detailed description thereof is omitted.

As illustrated in FIG. 17 and FIG. 18, a transistor 36 and an element separation insulative film 31 are provided on a semiconductor substrate 30 of the semiconductor device according to this exemplary embodiment; a resistance element 35 formed of, for example, a multicrystalline silicon layer (polysilicon layer) is provided on the element separation insulative film 31; and an inter-layer insulative film 32 is provided to cover the element separation insulative film 31 and the resistance element 35. In the interior of the inter-layer insulative film 32, a power supply lead 33, mutually insulated multiple layer leads, and vias that electrically connect these are formed; and an inductor element 34 according to the present invention is formed simultaneously by a formation step of the multiple layer leads. One terminal of the inductor element 34 is connected to the power supply lead 33, and the other terminal is connected to one terminal of the resistance element 35. The other terminal of the resistance element 35 is connected to a drain terminal of the transistor 36; and an output terminal 38 is provided on a metal lead between the resistance element 35 and a drain terminal of the transistor 36. A source terminal of the transistor 36 is connected to a grounding lead 39; a gate terminal of the transistor 36 is connected to an input terminal 37; and an amplifier generally referred to as a shunt peak amplifier is configured. Thereby, the semiconductor device according to this exemplary embodiment is configured.

As described in the manufacturing method of the first exemplary embodiment of the present invention, the inter-layer insulative film 32 generally may have a laminate structure of multiple layer insulative films; but in FIG. 17B, the inter-layer insulative film 32 is graphically represented as a single insulative film.

Also, in this exemplary embodiment, the resistance element 35 uses a polysilicon resistance; but alternatively, the resistance element 35 may be a silicide resistance in which a silicide such as, for example, NiSi and the like is formed on a polysilicon surface, or a completely silicided FUSI gate electrode; and these may be appropriately selected by the circuit designer. Further, a MOS transistor may be used as the resistance element 35.

Next, an operation of the semiconductor device according to this exemplary embodiment having the configuration according to the description above is described. The semiconductor device illustrated in FIG. 17 and FIG. 18 has the inductor element 34 added as a load, and thereby increases the impedance of the load in the high frequency band; and by compensating a decline of the gain in the high frequency band due to a parasitic capacitance, transforms an amplifiable frequency band to wideband or obtains a high gain in a designated frequency. In the case where an alternating current signal is applied to the input terminal 37, the alternating current signal is amplified by the output terminal 38.

According to this exemplary embodiment, the parasitic capacitance of the inductor element 34 is small, and therefore a semiconductor device that realizes a further transform of the amplification gain to wideband or a semiconductor device that can obtain a high gain at a designated frequency (realize a peaking operation) can be obtained. According to the semiconductor device according to this exemplary embodiment, the frequency band can be improved to an extremely high frequency band of about several tens of GHz.

In currently mainstream semiconductor devices, generally, a differential circuit that amplifies a differential signal is often used, but the semiconductor device according to this exemplary embodiment is a single-ended method. This is to prevent the graphical representation from becoming complex, and the claims of the present invention do not have any limitation for the circuit method that implements the inductor element according to the present invention.

As recited above, the embodiment of the implementation of the inductor element according to the present invention to a semiconductor device can be implemented similarly also for an inductor element according to any of the exemplary embodiments of the present invention.

Next, a tenth exemplary embodiment of the present invention is described. FIG. 19A is a schematic top view of an extracted essential portion of the semiconductor device according to this exemplary embodiment; and FIG. 19B is a cross-sectional view along line A-A of FIG. 19A. In FIG. 19, the same reference numerals are given to the same components of FIG. 1 to FIG. 18, and a detailed description thereof is omitted.

As illustrated in FIG. 19, the semiconductor device according to this exemplary embodiment includes a diffusion layer 40 to enclose an inductor 34 in the element separation insulative film 31 on the semiconductor substrate 30; a metal lead 41; and a contact 42; and a grounding lead is formed connecting to another metal lead (not illustrated) having a grounding potential. The metal lead 41 connects to the diffusion layer 40 via the contact 42.

It is favorable to increase the distance between the inductor element 34 and the grounding lead as much as possible; but the distance between the inductor element 34 and the grounding lead is determined by the circuit designer of the semiconductor device taking into consideration the effects of the eddy current excited in the grounding lead by a magnetic field created by the inductor element 34, the parasitic capacitance between the inductor element 34 and the grounding lead, the surface area of the semiconductor device, and the like. In this exemplary embodiment, an example is illustrated in which the grounding lead includes the diffusion layer 40 formed on the semiconductor substrate, the metal lead 41, and the contact 42; but the grounding lead is not limited thereto; and the grounding lead may be formed by only the diffusion layer 40; and in this case, to apply a grounding potential to the diffusion layer 40, the contact 42 and the metal lead 41 may be connected to a portion of the diffusion layer 40; and the metal lead 41 may be connected to another metal lead having the grounding potential. Further, the grounding lead may have a laminate structure formed in which multiple leads, having substantially the same shape as the metal lead 41, are formed across multiple layers in the upper layer of the metal lead 41 illustrated in FIG. 19B, connected by vias, and further connected to the metal lead 41 illustrated in FIG. 19.

According to this exemplary embodiment, in addition to the operations and effects of the ninth exemplary embodiment described above, effects of noise excited in the semiconductor substrate 30 due to the inductor element 34 exerted on another circuit element (not illustrated) formed on the semiconductor substrate 30 can be reduced.

Figure 20:
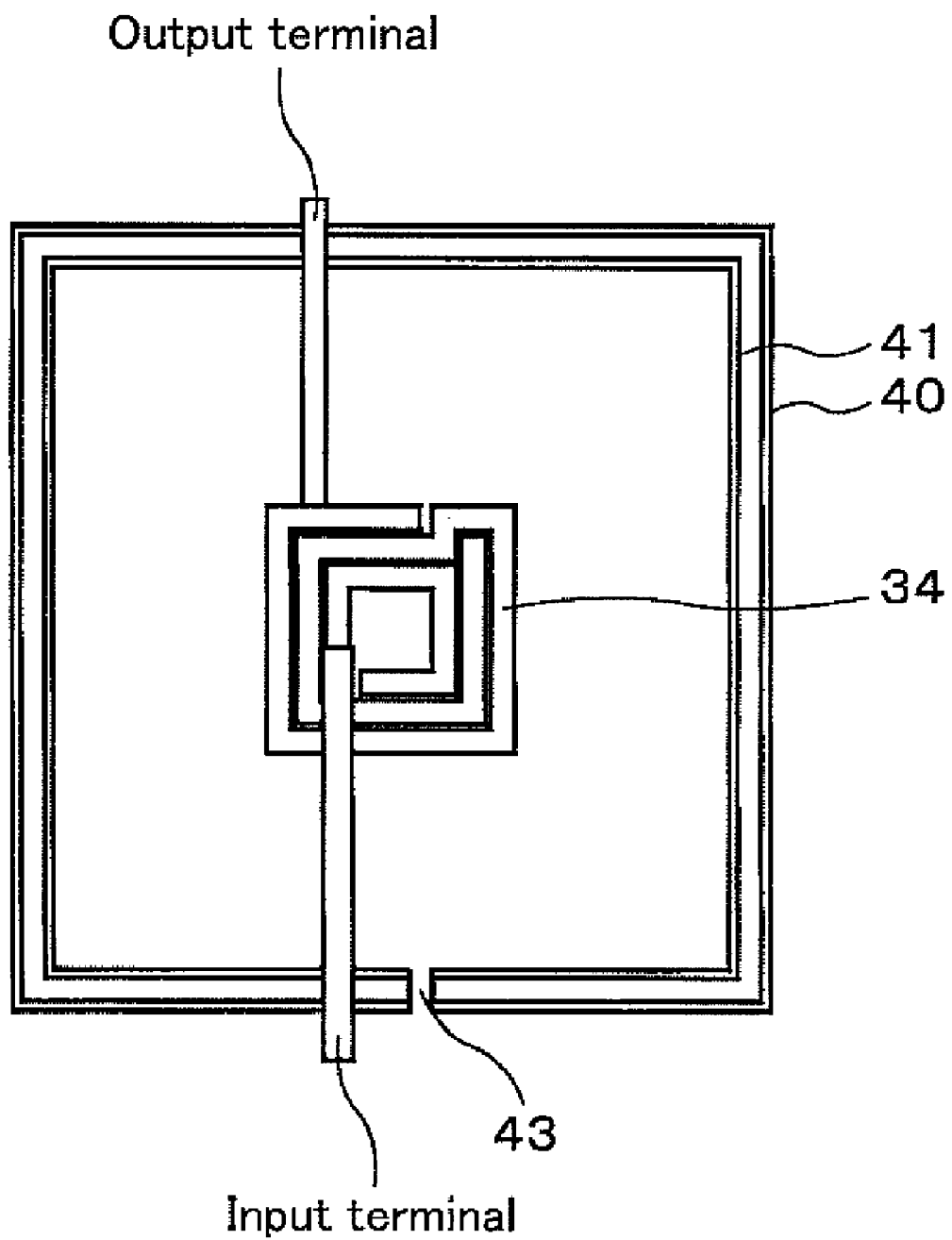
FIG. 20 is a schematic top view of an extracted essential portion of a semiconductor device according to an eleventh exemplary embodiment of the present invention.

Next, an eleventh exemplary embodiment of the present invention is described. FIG. 20 is a schematic top view of an extracted essential portion of the semiconductor device according to this exemplary embodiment. In FIG. 20, the same reference numerals are given to the same components of FIG. 1 to FIG. 19, and a detailed description thereof is omitted.

In the tenth exemplary embodiment described above, the grounding lead having a grounding potential is formed to enclose the inductor element 34; while in this exemplary embodiment, the grounding lead is different in the points of not completely coiling around the inductor element 34 and having a notch 43 in a portion; and except for these points, the grounding lead has a structure similar to that of the tenth exemplary embodiment.

According to this exemplary embodiment, in addition to the operations and effects of the tenth exemplary embodiment described above, an eddy current due to a magnetic field emitted by the inductor element 34 can be prevented from flowing in the grounding lead, and the performance of the inductor element 34 according to the present invention can be inhibited from deterioration due to the grounding lead.

Figure 21:
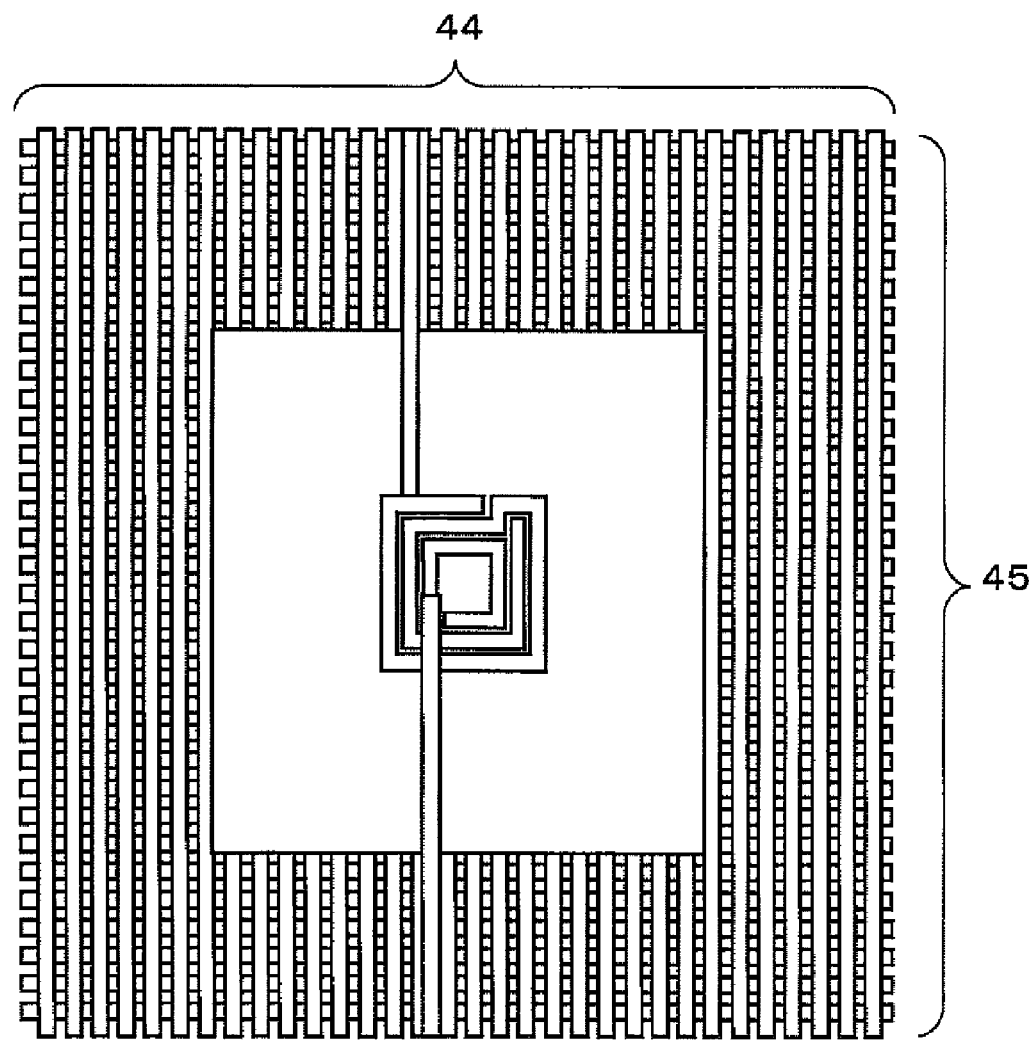
FIG. 21 is a schematic top view of an extracted essential portion of a semiconductor device according to a twelfth exemplary embodiment of the present invention.
Figure 22:
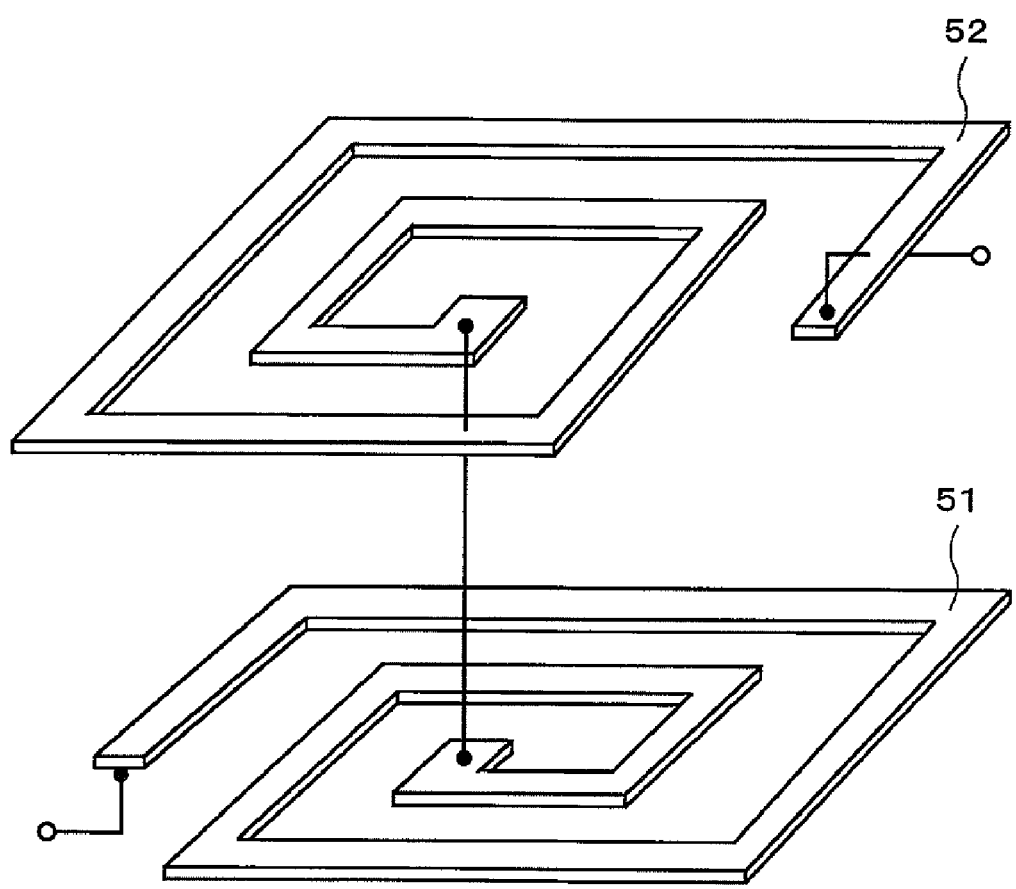
FIG. 22 is a schematic perspective view of an essential portion of a semiconductor device of conventional art.
Figure 23A:
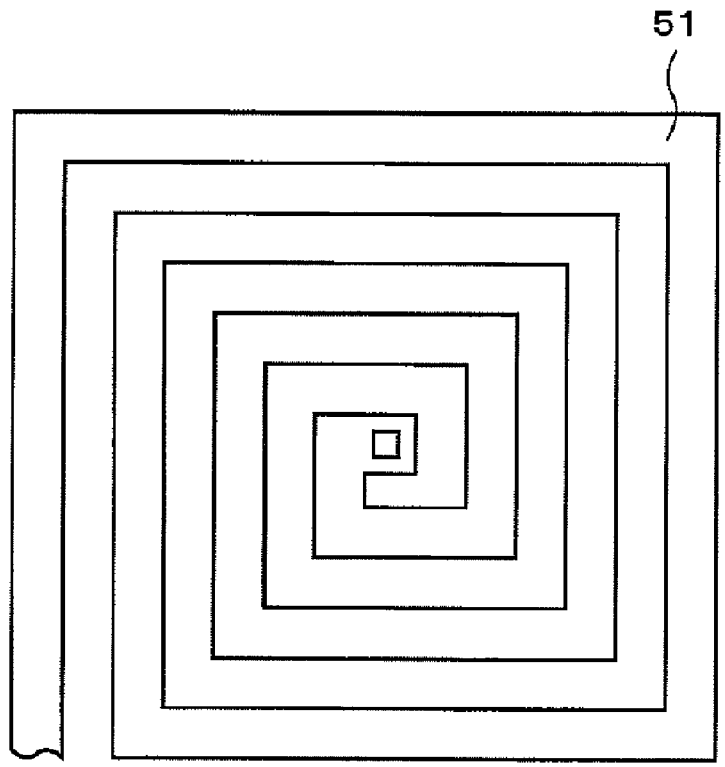
FIG. 23A is a schematic top view illustrating a spiral inductor of a layer below the semiconductor device of conventional art.
Figure 23B:
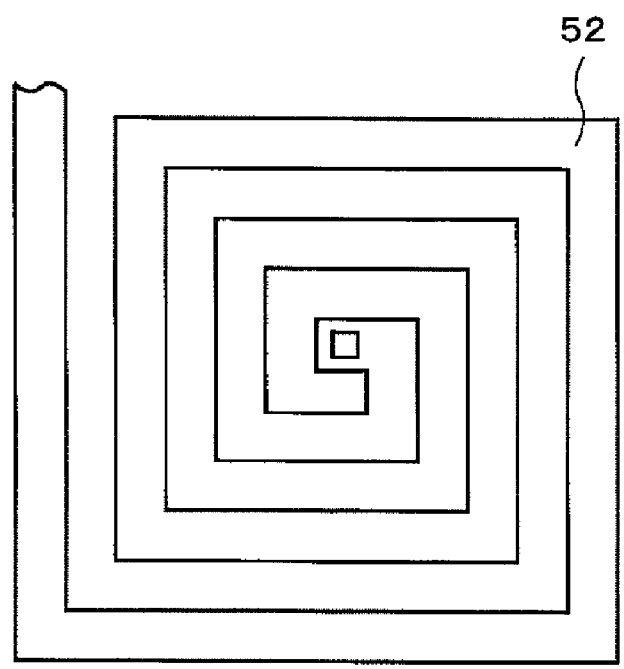
FIG. 23B is a schematic top view illustrating a spiral inductor of an upper layer of the same.
Figure 24:
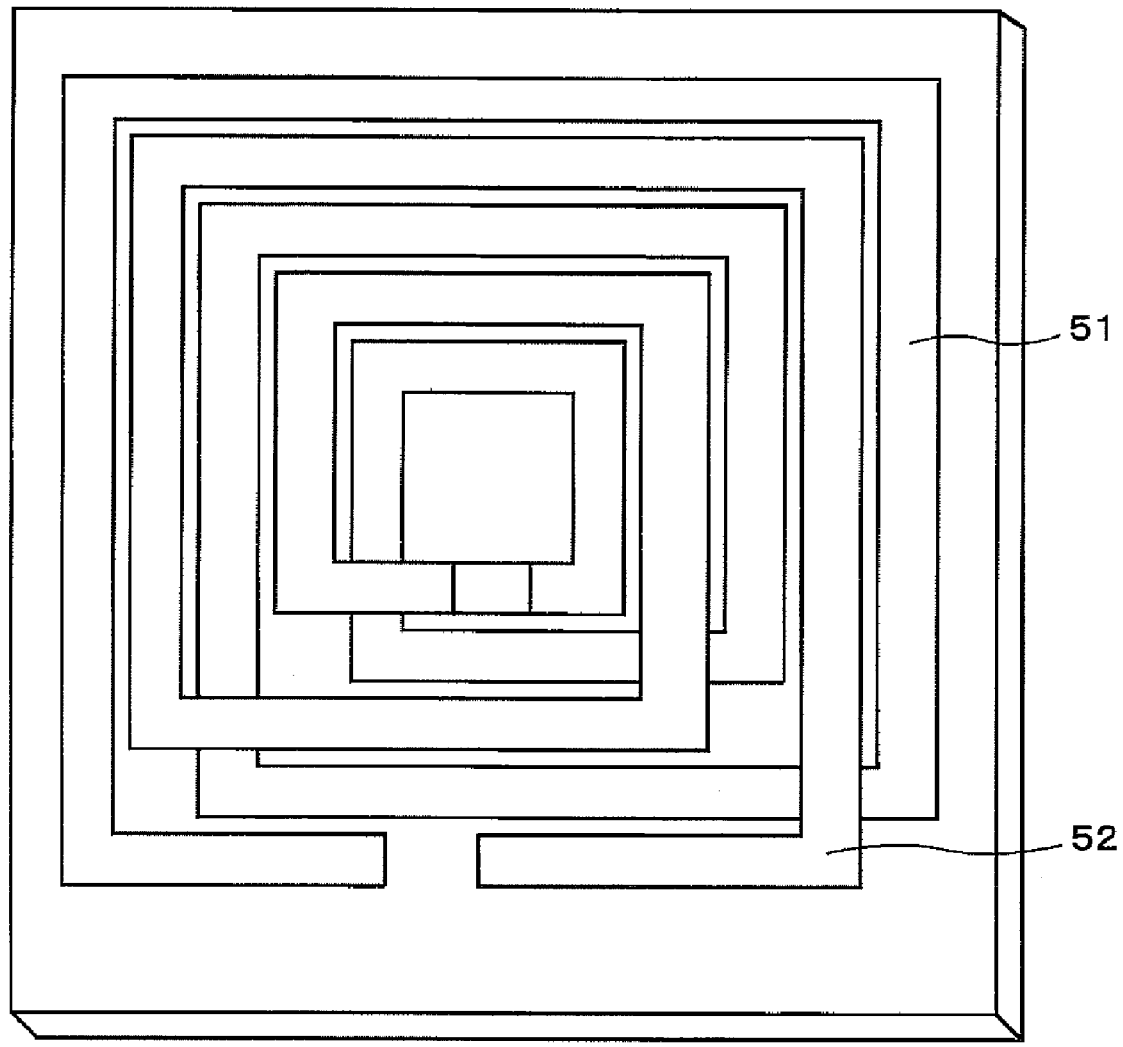
FIG. 24 is a schematic top view illustrating a spiral inductor of a semiconductor integrated circuit of conventional art.
Figure 25A:
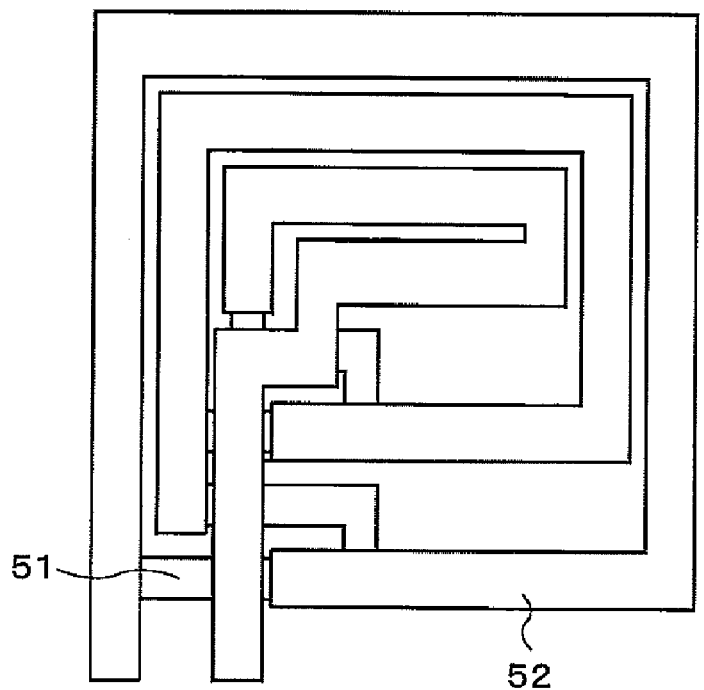
FIG. 25A is a schematic top view from the second lead 52 side.
Figure 25B:
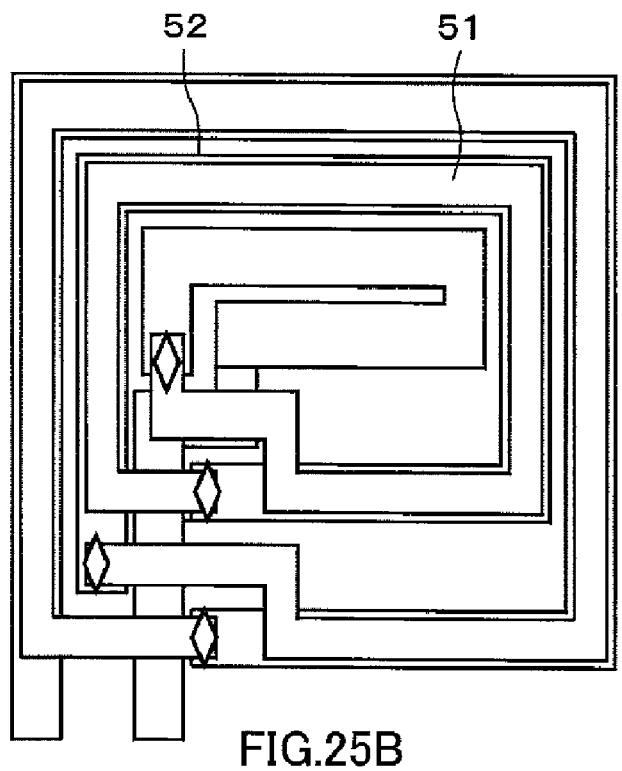
FIG. 25B similarly is a schematic bottom view from the first lead 51 side (semiconductor substrate side).

Next, a twelfth exemplary embodiment of the present invention is described. FIG. 21 is a schematic top view of an extracted essential portion of the semiconductor device according to this exemplary embodiment. In FIG. 21, the same reference numerals are given to the same components of FIG. 1 to FIG. 20, and a detailed description thereof is omitted.

In the semiconductor device according to this exemplary embodiment, as illustrated in FIG. 21, a lead group 44, in which leads having alternately disposed power supply potentials and grounding potentials, is formed in the uppermost layer lead layer of the semiconductor device around the inductor element 34; and a lead group 45, given alternating power supply potentials and grounding potentials similarly to the lead group 44, is formed in a layer below the uppermost layer lead of the semiconductor device and disposed orthogonally to the lead group 44.

The structure in which leads, alternately given a power supply potential and a grounding potential and disposed in a net shape in the uppermost layer lead layer and the lower layer leads of the uppermost layer leads, is used widely in recent semiconductor devices. As illustrated in FIG. 21, the lead groups 44 and 45 having power supply potentials and grounding potentials are not formed in a fixed region around the inductor element 34. Thereby, the performance deterioration of the inductor element due to an eddy current occurring in the lead groups 44 and 45 due to a magnetic field created by the inductor element 34 can be prevented; also, the occurrence of unintended parasitic capacitance between the inductor element 34 and the lead groups 44 and 45 having power supply potentials and grounding potentials can be inhibited.

It is favorable that the distance between the inductor element 34 and the lead groups 44 and 45 is increased as much as possible; but the distance between the inductor element 34 and the lead groups 44 and 45 is determined by the circuit designer taking into consideration the effects of the magnetic field created by the inductor element 34, the parasitic capacitance between the inductor element 34 and the lead groups 44 and 45, the surface area of the semiconductor device, and the like; and, for example, in the case where the uppermost layer leads of the leads of the inductor element 34 and the lead groups 44 and 45 are sufficiently separated by an inter-layer insulative film of multiple layer leads, and in the case where the eddy current excited in the lead groups 44 and 45 due to the magnetic field created by the inductor element 34 and the parasitic capacitance between the inductor element 34 and the lead groups 44 and 45 give only effects during circuit operation that are of an ignorable degree, it is possible also to form the lead groups 44 and 45 in a form to cover the inductor element 34 by the determination of the circuit designer.

According to this exemplary embodiment, a lead group having a power supply potential and a grounding potential is not formed in a fixed region around the inductor element 34; and thereby, the performance deterioration of the inductor element due to an eddy current occurring in a lead group due to a magnetic field created by the inductor element can be prevented; also, the occurrence of an unintended parasitic capacitance between the inductor element and a lead group having a power supply potential or a grounding potential can be inhibited.

According to the present invention, a solenoid coil shaped inductor element is formed on a semiconductor substrate; and thereby, the chip surface area can be reduced by increasing the inductance value per unit surface area, and the number of semiconductor devices obtained from a semiconductor substrate can be increased; and therefore, the manufacturing cost of the semiconductor device can be reduced. Further, it is possible also to reduce the size of various signal processing devices included in the semiconductor device.

Also, it is possible to reduce the parasitic capacitance of the inductor element, and therefore the high frequency characteristics of a semiconductor device including the inductor element and an active element can be improved.

Further, the spacing between the inductor element and adjacent elements can be reduced; and from this point as well, the chip surface area can be reduced and the manufacturing cost of the semiconductor device can be reduced.

The present invention can be utilized in a semiconductor device having transistors and multiple layer leads. With the performance improvement of the semiconductor element, hereafter, it can be expected that the operation frequency will increase. Also, it may be considered that applications in high frequency bands used in wireless communications will expand further. According to the present invention, it is possible to reduce the surface area that the inductor occupies in the chip, which is necessary in a semiconductor device that needs to operate at high frequencies. Further, it is possible to inhibit the increase of unintended parasitic capacitance. Thereby, a semiconductor device that realizes high performance and high reliability can be submitted.

INDUSTRIAL APPLICABILITY

The present invention is useful as an inductor element used in high frequency circuits and the like and as a semiconductor element including the inductor element.

The invention claimed is:
1. An inductor element formed in a multiple layer lead structure comprising:
a lead,
an insulative layer that insulates leads above and below, and
a via provided in the insulative layer and connecting leads above and below,
wherein lead layers are multiply laminated layers, comprising at least a portion of at least a pair of vertically adjacent leads which are coiled leads;
wherein the coiled leads are connected in series,
wherein at least two of the coiled leads comprise a shape having one wind;
wherein a shape having said one wind does not completely coil around and has a notch in a portion thereof;
wherein current directions of vertically adjacent coiled leads are the same by a via provided on an end portion thereof, and form a serial inductance; and
wherein an inter-lead capacitance of the vertically adjacent coiled leads is larger than an inter-lead capacitance between other coiled leads formed in the same lead layer.

2. The inductor element according to claim 1, wherein the vertically adjacent coiled leads are provided in not less than three lead layers, and not less than three layers of the coiled leads are connected in series by the via to make flow directions of currents the same.

3. The inductor element according to claim 1, wherein a lead width of the coiled leads is larger than a lead height of the coiled leads.

4. The inductor element according to claim 1, wherein spacing between other coiled leads formed in the same lead layer is equal to or larger than spacing between the vertically adjacent coiled leads.

5. The inductor element according to claim 4, wherein an effective relative dielectric constant of an insulative film that insulatively separates leads of the vertically adjacent coiled leads is larger than an effective relative dielectric constant of an insulative film that insulatively separates other coiled leads formed in the same lead layer.

6. The inductor element according to claim 1, wherein: at least one of the coiled leads comprises a shape having two winds; a coiled lead other than the coiled lead having two winds comprises a shape having the one wind; and at least two coiled leads comprising the one-wind shape are formed in the same lead layer.

7. The inductor element according to claim 1, wherein the inductor element is formed by at least two layers of coiled leads.

8. The inductor element according to claim 1, wherein at least one of the coiled leads positioned in the uppermost layer comprises a shape having two winds in the same lead layer.

9. The inductor element according to claim 1, wherein at least one of the coiled leads positioned in the lowermost layer comprises a shape having two winds in the same lead layer.

10. The inductor element according to claim 1, wherein all of the lead heights of the coiled leads are substantially the same.

11. The inductor element according to claim 1, wherein at least one of draw out leads connected to an end portion of the coiled lead for electrically connecting to an external element is formed in a lead layer different than a lead layer wherein the coiled lead is formed.

12. The inductor element according to claim 11, further comprising a plurality of slits equidistantly formed with respect to each other in the coiled leads and the draw out lead.

13. The inductor element according to claim 1, wherein at least one of draw out leads connected to an end portion of the coiled lead for electrically connecting to an external element is formed by an elongation of any lead positioned at an outermost circumference of the coiled lead.

14. The inductor element according to claim 1, wherein distances between other coiled leads formed in the same lead layer are all substantially the same in the same lead layer.

15. The inductor element according to claim 1, wherein the coiled leads comprise a slit.

16. The inductor element according to claim 11, wherein the draw out lead comprises a slit.

17. The inductor element according to claim 1, wherein dummy metal is multiply formed in a lead layer wherein the coiled leads are formed, and a density of the dummy metal of a side proximal to the coiled leads is lower than a density of the dummy metal of a side distal to the coiled leads.

18. The inductors element according to claim 17, wherein the dummy metal is formed at the outside in a radial direction of the coiled leads, not inside in the radial direction of the coiled leads.

19. The inductor element according to claim 1, wherein dummy metal is multiply formed in a lead layer positioned in a layer above or below a lead layer wherein the coiled leads are formed, and a density of the dummy metal of a side proximal to the coiled leads is lower than a density of the dummy metal of a side distal to the coiled leads.

20. A semiconductor device comprising the inductor element according to claim 1.

21. The inductor element according to claim 1, wherein the coiled leads include inner circumference coiled leads and outer circumference coiled leads.

22. A semiconductor device wherein the inductor element recited in claim 1 and a transistor is connected with each other.

23. The semiconductor device according to claim 1, comprising a ground lead provided around the inductor element.

24. A semiconductor device comprising fixed potential leads having a mesh-like shape around the inductor element according to claim 1.

25. The inductor element according to claim 1, wherein said leads are completely covered by the insulative.

26. A semiconductor device comprising the inductor element according to claim 1, formed on a semiconductor substrate that is formed of a transistor.

27. A method for manufacturing an inductor element, comprising: forming a lead layer wherein a coiled lead on an insulative film and a via that connects coiled leads are provided;

laminating lead layers wherein an inter-lead capacitance of the vertically adjacent coiled leads is larger than an inter-lead capacitance between other coiled leads formed in the same lead layer; and forming a draw out lead for electrically connecting the coiled lead to an external element, wherein at least two of the coiled leads comprise a shape having one wind; and wherein a shape having said one wind does not completely coil around and has a notch in a portion thereof.

* * * * *